(12) United States Patent
Kitano

(10) Patent No.: US 11,582,416 B2
(45) Date of Patent: Feb. 14, 2023

(54) SOLID-STATE IMAGE SENSOR, IMAGING DEVICE, AND METHOD OF CONTROLLING SOLID-STATE IMAGE SENSOR

(71) Applicant: SONY SEMICONDUCTOR SOLUTIONS CORPORATION, Kanagawa (JP)

(72) Inventor: Shin Kitano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 127 days.

(21) Appl. No.: 15/734,660

(22) PCT Filed: Apr. 22, 2019

(86) PCT No.: PCT/JP2019/016989
§ 371 (c)(1),
(2) Date: Dec. 3, 2020

(87) PCT Pub. No.: WO2019/239722
PCT Pub. Date: Dec. 19, 2019

(65) Prior Publication Data
US 2021/0235036 A1 Jul. 29, 2021

(30) Foreign Application Priority Data

Jun. 12, 2018 (JP) .............................. JP2018-111505

(51) Int. Cl.
*H04N 5/3745* (2011.01)
*H04N 5/369* (2011.01)
(Continued)

(52) U.S. Cl.
CPC ... *H04N 5/37455* (2013.01); *H01L 27/14612* (2013.01); *H01L 27/14643* (2013.01);
(Continued)

(58) Field of Classification Search
None
See application file for complete search history.

(56) References Cited

U.S. PATENT DOCUMENTS 6,188,093 B1 * 2/2001 Isogai ............... H01L 27/14643
257/292
8,946,845 B1 * 2/2015 Hynecek ............. H01L 27/1463
257/233
(Continued)

FOREIGN PATENT DOCUMENTS

JP 64-072667 A 3/1989
JP 2004-282679 A 10/2004
(Continued)

OTHER PUBLICATIONS

International Search Report and Written Opinion of PCT Application No. PCT/JP2019/016989, dated Jul. 9, 2019, 10 pages of ISRWO.

*Primary Examiner* — Mark T Monk
(74) *Attorney, Agent, or Firm* — Chip Law Group

(57) ABSTRACT

To improve image quality of image data in a solid-state image sensor that detects an address event. The solid-state image sensor includes a photodiode, a pixel signal generation unit, and a detection unit. In the solid-state image sensor, the photodiode generates electrons and holes by photoelectric conversion. The pixel signal generation unit generates a pixel signal having a voltage according to an amount of one of the electrons and the holes. The detection unit detects whether or not a change amount in the other of the electrons and the holes has exceeded a predetermined threshold and outputs a detection signal.

16 Claims, 23 Drawing Sheets

(51) Int. Cl.
*H04N 5/355* (2011.01)
*H04N 17/00* (2006.01)
*H01L 27/146* (2006.01)
*H01L 27/148* (2006.01)
*H04N 5/363* (2011.01)

(52) U.S. Cl.
CPC ....... *H01L 27/14831* (2013.01); *H04N 5/363* (2013.01); *H04N 5/379* (2018.08)

(56) References Cited

U.S. PATENT DOCUMENTS

| | | |
|---|---|---|
| 2015/0319369 A1 | 11/2015 | Serrano Gotarredona et al. |
| 2017/0155865 A1 | 6/2017 | Nakajima et al. |
| 2017/0323912 A1* | 11/2017 | Lahav ................ H04N 5/37452 |
| 2018/0167575 A1 | 6/2018 | Watanabe et al. |

FOREIGN PATENT DOCUMENTS

| | | |
|---|---|---|
| JP | 2016-501495 A | 1/2016 |
| JP | 2016-533140 A | 10/2016 |
| WO | 2015/159728 A1 | 10/2015 |
| WO | 2017/013806 A1 | 1/2017 |

* cited by examiner

SOLID-STATE IMAGE SENSOR, IMAGING DEVICE, AND METHOD OF CONTROLLING SOLID-STATE IMAGE SENSOR

CROSS REFERENCE TO RELATED APPLICATIONS

This application is a U.S. National Phase of International Patent Application No. PCT/JP2019/016989 filed on Apr. 22, 2019, which claims priority benefit of Japanese Patent Application No. JP 2018-111505 filed in the Japan Patent Office on Jun. 12, 2018. Each of the above-referenced applications is hereby incorporated herein by reference in its entirety.

TECHNICAL FIELD

The present technology relates to a solid-state image sensor, an imaging device, and a method of controlling a solid-state image sensor. More specifically, the present technology relates to a solid-state image sensor that detects whether or not a change amount in luminance has exceeded a threshold, an imaging device, and a method of controlling a solid-state image sensor.

BACKGROUND ART

Conventionally, a synchronous solid-state image sensor for capturing image data in synchronization with a synchronization signal such as a vertical synchronization signal has been used in an imaging device or the like. The typical synchronous solid-state image sensor can acquire the image data only every cycle (for example, every 1/60 seconds) of the synchronization signal. Therefore, such a synchronous solid-state image sensor has a difficulty in dealing with a request of higher-speed processing in the fields of traffic, robots, and the like. Therefore, an asynchronous solid-state image sensor has been proposed, which detects, for each pixel address, whether or not a change amount in luminance of a pixel of the pixel address has exceeded a predetermined threshold as an address event in real time (for example, see Patent Document 1). Such a solid-state image sensor for detecting an address event for each pixel is called dynamic vision sensor (DVS).

CITATION LIST

Patent Document

Patent Document 1: PCT Japanese Translation Patent Publication No. 2016-533140

SUMMARY OF THE INVENTION

Problems to be Solved by the Invention

The above-described asynchronous solid-state image sensor (that is, DVS) can generate and output image data at a much higher speed than the synchronous solid-state image sensor. Furthermore, in the asynchronous DVS, a pixel circuit in the synchronous solid-state image sensor that shares a photodiode with an asynchronous circuit can be further added, and image data with higher image quality than that of the synchronous solid-state image sensor can be further generated. However, a solid-state image sensor provided with asynchronous and synchronous circuits that shares a photodiode has a problem that improvement of the image quality of image data is difficult. This is because, in a case where the photodiode generates and transfers electrons, some of the electrons is transferred to the asynchronous circuit and the rest is transferred to the synchronous circuit, and the amount of electrons transferred to each circuit becomes smaller than a case where only one of the asynchronous and synchronous circuits is provided. If the area of the photodiode is made large, the amount of charge can be increased and the image quality can be improved but a mounting area is increased, which is not desirable.

The present technology has been made in view of such a situation, and an object is to improve the image quality of image data in a solid-state image sensor that detects an address event.

Solutions to Problems

The present technology has been made to solve the above problems, and the first aspect thereof is a solid-state image sensor including a photodiode configured to generate electrons and holes by photoelectric conversion, a pixel signal generation unit configured to generate a pixel signal of a voltage according to an amount of one of the electrons and the holes, and a detection unit configured to detect whether or not a change amount in the other of the electrons and the holes has exceeded a predetermined threshold and output a detection signal, and a method of controlling the solid-state image sensor. This brings about an effect of generating the pixel signal from one of the electrons and the holes and detecting an address event from the other of the electrons and the holes.

Furthermore, in the first aspect, the pixel signal generation unit may generate the pixel signal of the voltage according to the amount of the electrons, and the detection unit may detect whether or not the change amount in the holes has exceeded the threshold. This brings about an effect of generating the pixel signal from the electrons and detecting an address event from the holes.

Furthermore, in the first aspect, the photodiode and a part of the pixel signal generation unit may be arranged on a predetermined light-receiving chip, and a rest of the pixel signal generation unit and the detection unit may be arranged on a predetermined circuit chip. This brings about an effect of reducing circuit scales of the light-receiving chip and the circuit chip.

Furthermore, in the first aspect, the pixel signal generation unit may include a pixel circuit configured to generate the pixel signal, and a comparison circuit configured to compare the pixel signal with a predetermined reference signal, the photodiode, the pixel circuit, and a part of the comparison circuit may be arranged on the light-receiving chip, and a rest of the comparison circuit and the detection unit may be arranged on the circuit chip. This brings about an effect of reducing circuit scales of the light-receiving chip and the circuit chip.

Furthermore, in the first aspect, the pixel signal generation unit may include a pixel circuit configured to generate the pixel signal, and a comparison circuit configured to compare the pixel signal with a predetermined reference signal, and the photodiode and the pixel circuit may be arranged on the light-receiving chip, and the comparison circuit and the detection unit may be arranged on the circuit chip. This brings about an effect of reducing circuit scales of the light-receiving chip and the circuit chip.

Furthermore, in the first aspect, a drive unit configured to drive the pixel signal generation unit to generate the pixel signal in a case where the detection unit detects that the change amount has exceeded the threshold may be further included. This brings about an effect of reading only the pixel signal of a pixel in which an address event has occurred.

Furthermore, in the first aspect, a column processing unit configured to perform predetermined signal processing for the pixel signal and output the pixel signal, and a control circuit configured to control the column processing unit to output the pixel signal in a case where the change amount having exceeded the threshold is detected within a predetermined exposure period may be further included. This brings about an effect of outputting only the pixel signal of a pixel in which an address event has occurred within the exposure period.

Furthermore, in the first aspect, the photodiode, the pixel signal generation unit, and the detection unit may be respectively arranged on a plurality of pixels, and the pixel signal generation unit may include a pixel circuit configured to generate the analog pixel signal, and an analog-digital converter configured to convert the pixel signal into a digital signal and output the digital signal. This brings about an effect that the pixel signal is converted into the digital signal for each pixel.

Furthermore, in the first aspect, an analog-digital converter configured to convert the analog pixel signal into a digital signal may be further included, and the photodiode, the pixel signal generation unit, and the detection unit may be respectively arranged on a plurality of pixels, and the pixel signal generation unit may generate the analog pixel signal and output the analog pixel signal to the analog-digital converter. This brings about an effect that the pixel signal is converted into the digital signal outside a pixel.

Furthermore, in the first aspect, the pixel signal generation unit may include a charge accumulation unit configured to accumulate a charge of one of the electrons and the holes, a floating diffusion layer configured to accumulate the charge and convert the charge into the voltage according to an amount of the charge, a first transfer transistor configured to transfer the charge from the photodiode into the charge accumulation unit, and a second transfer transistor configured to transfer the charge from the charge accumulation unit to the floating diffusion layer. This brings about an effect of sequentially performing transfer of the charge to the charge accumulation unit and transfer of the charge to the floating diffusion layer.

Furthermore, in the first aspect, the detection unit may include a conversion unit configured to convert a photocurrent including the other of the electrons and the holes into a voltage, a subtractor configured to obtain a change amount in the voltage by subtraction, and a comparator configured to compare the change amount with the threshold and outputs a comparison result as the detection signal. This brings about an effect that the photocurrent is converted into a voltage and an address event is detected by comparison between the change amount with the threshold.

Furthermore, in the first aspect, the detection unit may further include a buffer that outputs a signal of the voltage from the conversion unit to the subtractor. This brings about an effect of improving a driving ability of a subsequent circuit of the buffer.

Furthermore, in the first aspect, the conversion unit may include a plurality of stages of loop circuits, and each of the plurality of stages of loop circuits includes a pair of transistors connected in a loop manner. This brings about an effect of improving a conversion gain of the conversion unit.

Furthermore, in the first aspect, the conversion unit may include a pair of transistors connected in a loop manner, and a capacitor connected to gates of the pair of transistors. This brings about an effect of improving stability of the conversion unit.

Furthermore, the second aspect of the present technology is an imaging device including a photodiode configured to generate electrons and holes by photoelectric conversion, a pixel signal generation unit configured to generate a pixel signal of a voltage according to an amount of one of the electrons and the holes, a detection unit configured to detect whether or not a change amount in the other of the electrons and the holes has exceeded a predetermined threshold and output a detection signal, and a digital signal processing unit configured to perform predetermined processing for the detection signal and the pixel signal. This brings about an effect of processing the pixel signal generated from the electrons and the detection signal generated from the holes.

Effects of the Invention

According to the present technology, an excellent effect of improving the image quality of image data can be exhibited in a solid-state image sensor that detects an address event. Note that the effects described here are not necessarily limited, and any of effects described in the present disclosure may be exhibited.

MODE FOR CARRYING OUT THE INVENTION

Hereinafter, modes for implementing the present technology (hereinafter referred to as embodiments) will be described. Description will be given according to the following order.

1. First Embodiment (an example of generating a pixel signal from electrons and generating a detection signal from holes)

2. Second Embodiment (an example of generating a pixel signal from electrons and generating a detection signal from holes in a solid-state image sensor having a stacked structure)

3. Third Embodiment (an example of generating a pixel signal from electrons in a pixel in which a detection signal is generated from holes)

4. Fourth Embodiment (an example of transferring electrons to an analog memory and generating a pixel signal, and generating a detection signal from holes)

5. Fifth Embodiment (an example of providing a buffer, generating a pixel signal from electrons, and generating a detection signal from holes)

6. Sixth Embodiment (an example of setting loop circuits in two stages, generating a pixel signal from electrons, and generating a detection signal from holes)

7. Seventh Embodiment (an example of adding a capacitor, generating a pixel signal from electrons, and generating a detection signal from holes)

8. Applications to Moving Bodies

1. First Embodiment

[Configuration Example of Imaging Device]

Figure 1:
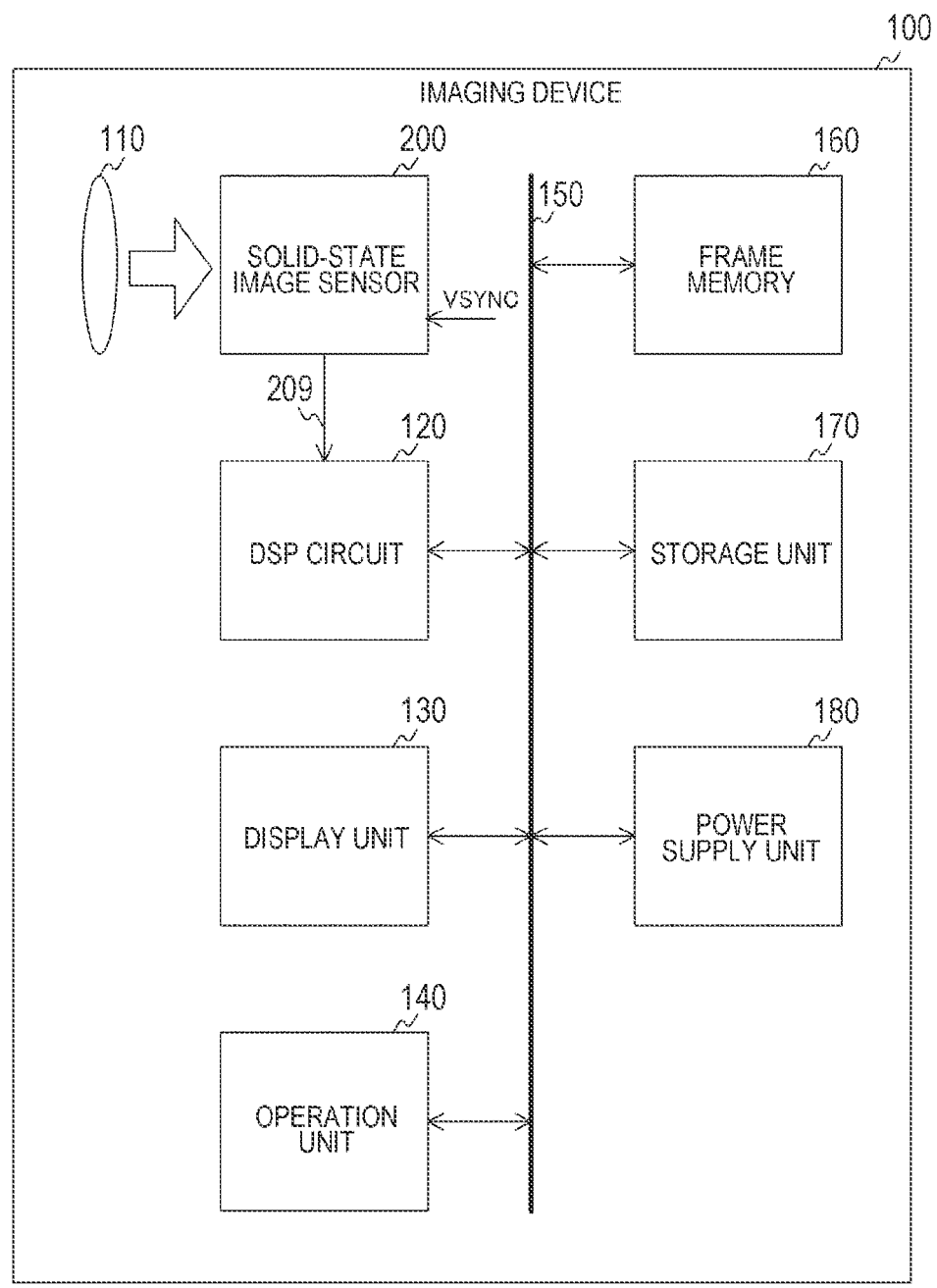
FIG. 1 is a block diagram illustrating a configuration example of an imaging device according to a first embodiment of the present technology.

FIG. 1 is a block diagram illustrating a configuration example of an imaging device 100 according to a first embodiment of the present technology. The imaging device 100 is a device for imaging image data, and includes an optical unit 110, a solid-state image sensor 200, and a digital signal processing (DSP) circuit 120. Moreover, the imaging device 100 includes a display unit 130, an operation unit 140, a bus 150, a frame memory 160, a storage unit 170, and a power supply unit 180. As the imaging device 100, for example, a smartphone or a personal computer having an imaging function, an in-vehicle camera, or the like is assumed in addition to a digital camera such as a digital still camera.

The optical unit 110 condenses light from an object and guides the light to the solid-state image sensor 200. The solid-state image sensor 200 generates image data by photoelectric conversion in synchronization with a vertical synchronization signal VSYNC. Here, the vertical synchronization signal VSYNC is a periodic signal having a predetermined frequency indicating imaging timing. The solid-state image sensor 200 supplies the generated image data to the DSP circuit 120 via a signal line 209.

The DSP circuit 120 executes predetermined signal processing for the image data from the solid-state image sensor 200. The DSP circuit 120 outputs the processed image data to the frame memory 160 or the like via the bus 150. Note that the DSP circuit 120 is an example of a digital signal processing unit described in the claims.

The display unit 130 displays the image data. As the display unit 130, a liquid crystal panel or an organic electro luminescence (EL) panel is assumed, for example. The operation unit 140 generates an operation signal according to a user operation.

The bus 150 is a common path for the optical unit 110, the solid-state image sensor 200, the DSP circuit 120, the display unit 130, the operation unit 140, the frame memory 160, the storage unit 170, and the power supply unit 180 to exchange data with one another.

The frame memory 160 stores the image data. The storage unit 170 stores various data such as the image data. The power supply unit 180 supplies power to the solid-state image sensor 200, the DSP circuit 120, the display unit 130, and the like.

[Configuration Example of Solid-State Image Sensor]

Figure 2:
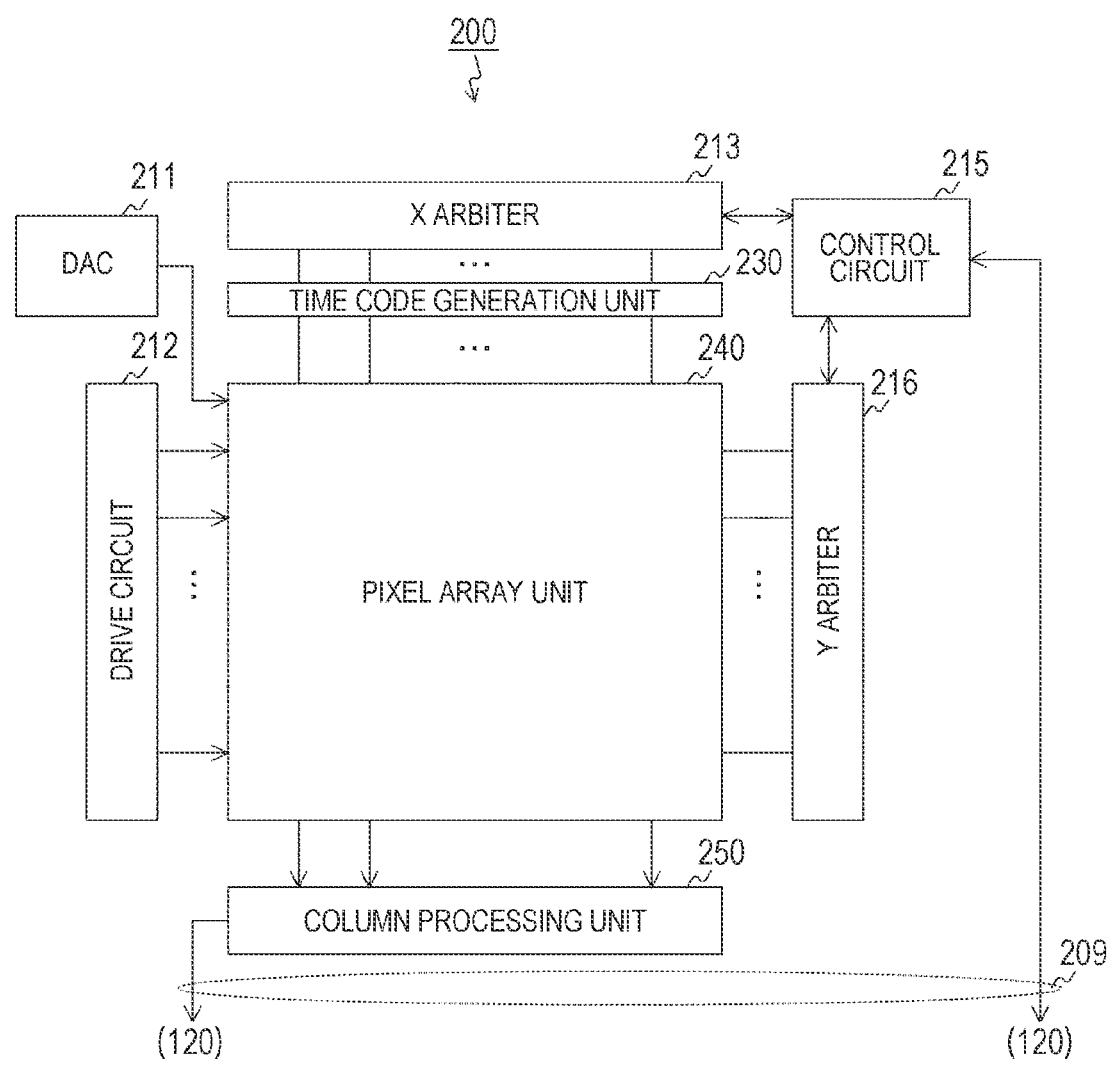
FIG. 2 is a block diagram illustrating a configuration example of a solid-state image sensor according to the first embodiment of the present technology.

FIG. 2 is a block diagram illustrating a configuration example of the solid-state image sensor 200 according to the first embodiment of the present technology. The solid-state image sensor 200 includes a digital to analog converter (DAC) 211, a drive circuit 212, an X arbiter 213, a time code generation unit 230, a pixel array unit 240, a column processing unit 250, a control circuit 215, and a Y arbiter 216. These circuits are arranged on, for example, a single semiconductor chip. Furthermore, in the pixel array unit 240, a plurality of pixels is arrayed in a two-dimensional lattice manner. Hereinafter, a set of the pixels arrayed in a predetermined direction in the pixel array unit 240 will be referred to as a "row", and a set of the pixels arrayed in a direction perpendicular to the row will be referred to as a "column".

The DAC 211 generates an analog reference signal that changes in a slope manner by digital to analog (DA) conversion. The DAC 211 supplies the reference signal to the pixel array unit 240.

The drive circuit 212 drives the pixels in the pixel array unit 240 in synchronization with the vertical synchronization signal VSYNC.

Each of the pixels in the pixel array unit 240 generates a pixel signal. Furthermore, the pixel also generates a detection signal of an address event in addition to the pixel signal. Here, the address event includes an on-event and an off-event, and the detection signal includes a one-bit on-event detection result and a one-bit off-event detection result. The on-event means that a change amount in luminance has exceeded a predetermined upper limit threshold. Meanwhile, the off-event means that the change amount in luminance has fallen below a predetermined lower limit threshold. Note that the pixel detects both the on event and the off event, but the pixel can detect only one of the on-event and the off-event.

The pixel supplies the pixel signal to the column processing unit 250. Furthermore, the pixel transmits and receives a request and a response (hereinafter, referred to as "handshake") to and from the Y arbiter 216 when having detected an address event in order to output the detection signal of the address event to the outside. The pixel then performs a handshake with the X arbiter 213.

The X arbiter 213 arbitrates requests from columns and returns a response to a corresponding column on the basis of an arbitration result.

The time code generation unit 230 generates a time code. The time code indicates a time within a period in which the reference signal changes in a slope manner. The time code generation unit 230 supplies the generated time code to the pixel array unit 240.

The column processing unit 250 performs signal processing such as correlated double sampling (CDS) processing for the pixel signal and supplies the processed pixel signal to the DSP circuit 120.

The Y arbiter 216 arbitrates requests from rows and returns a response to a corresponding row on the basis of an arbitration result.

The control circuit 215 outputs the detection signal of the address event to the DSP circuit 120 on the basis of the request arbitration result. Image data is generated by arraying the detection signal of the address event for each pixel in a two-dimensional lattice manner.

Hereinafter, image data formed using the pixel signals output from the column processing unit 250 will be referred to as "normal image data", and image data formed using the detection signals of the address events will be referred to as "AER image data". The data size of the pixel signal is larger than the detection signal and is, for example, 15 bits. Therefore, the normal image data has higher image quality than the AER image data.

The normal image data and the AER image data are used in various applications. For example, in the case where the imaging device 100 is an in-vehicle camera, the normal image data is displayed on a monitor or the like for a driver to visually recognize the normal image data. Meanwhile, the AER image data is used to detect a person or an obstacle in an advanced driver assistance system (ADAS) or the like.

Note that the solid-state image sensor 200 outputs all the pixel signals of the normal image data but the solid-state image sensor 200 can output only the pixel signals of pixels in which the address event has occurred, which will be described below.

[Configuration Example of Pixel Array Unit]

Figure 3:
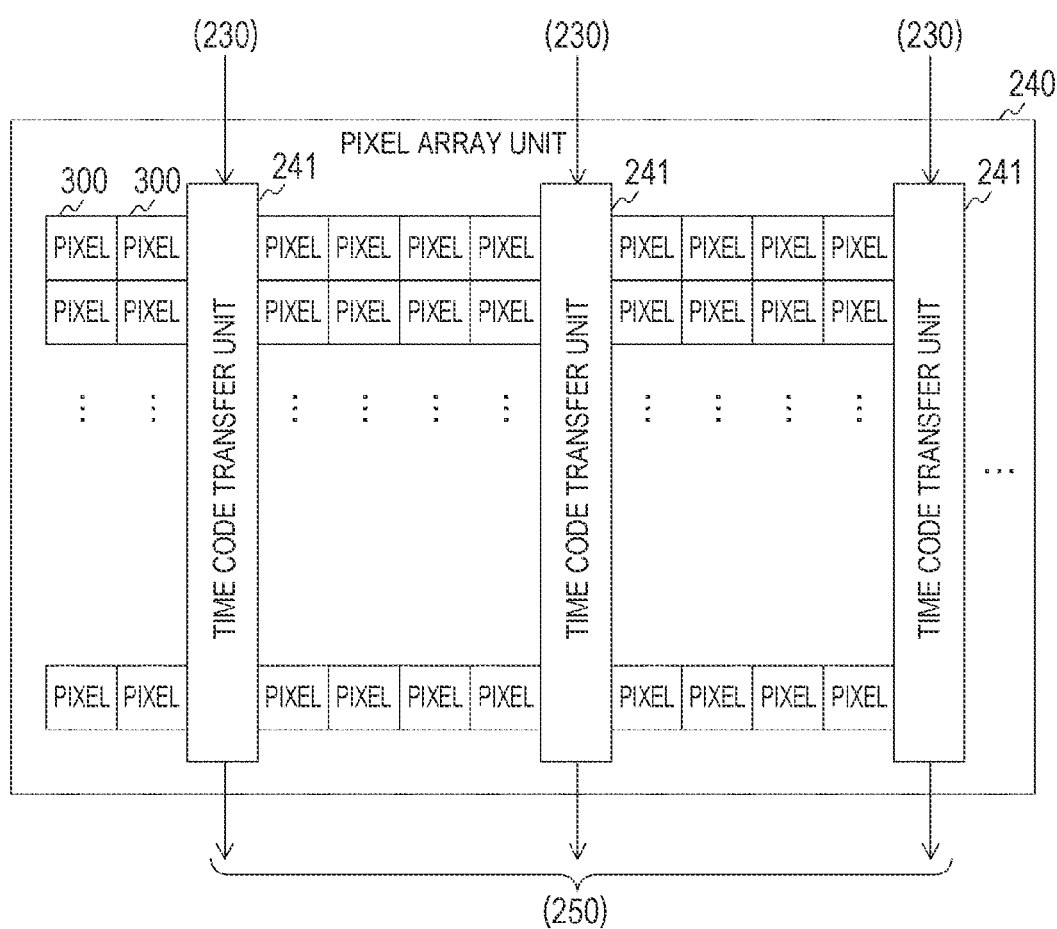
FIG. 3 is a block diagram illustrating a configuration example of a pixel array unit according to the first embodiment of the present technology.

FIG. 3 is a block diagram illustrating a configuration example of the pixel array unit 240 according to the first embodiment of the present technology. The pixel array unit 240 includes a plurality of time code transfer units 241 and a plurality of pixels 300. The time code transfer unit 241 is arranged for each time code generation unit 230. Furthermore, the pixels 300 are arrayed in a two-dimensional lattice manner.

The time code transfer unit 241 transfers the time code from the corresponding time code generation unit 230. The time code transfer unit 241 transfers the time code from the corresponding time code generation unit 230 to the pixel 300 and also transfers the time code from the pixel 300 to the column processing unit 250 as a digital pixel signal.

[Configuration Example of Pixel]

Figure 4:
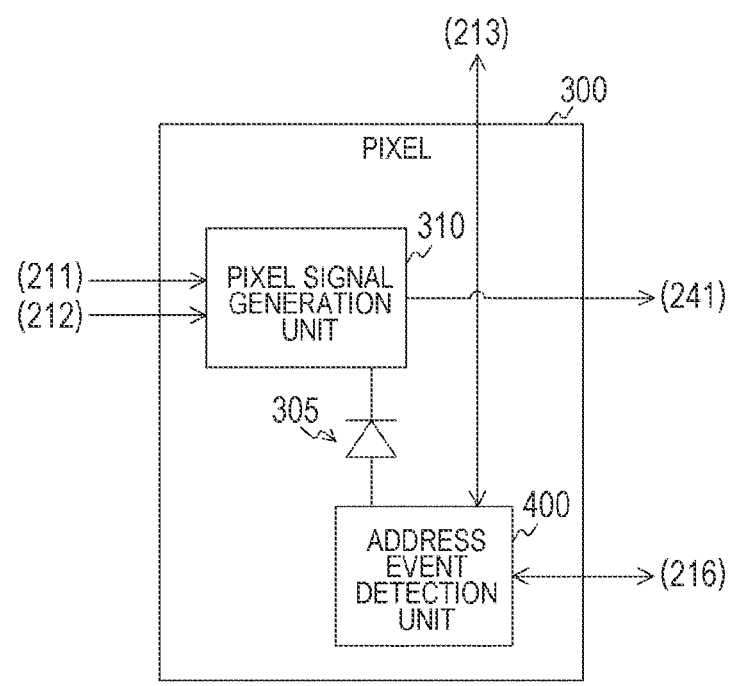
FIG. 4 is a block diagram illustrating a configuration example of a pixel according to the first embodiment of the present technology.

FIG. 4 is a block diagram illustrating a configuration example of the pixel 300 according to the first embodiment of the present technology. The pixel 300 includes the photodiode 305, the pixel signal generation unit 310, and the address event detection unit 400. Furthermore, one of an anode and a cathode of the photodiode 305 is connected to the pixel signal generation unit 310, and the other is connected to the address event detection unit 400. For example, the cathode of the photodiode 305 is connected to the pixel signal generation unit 310, and the anode is connected to the address event detection unit 400.

The pixel signal generation unit 310 generates a pixel signal of a voltage according to an amount of charge from the photodiode 305. The pixel signal generation unit 310 converts an analog pixel signal into a digital signal (that is, a time code) and supplies the digital signal to the time code transfer unit 241.

The address event detection unit 400 detects whether or not a change amount in the charge from the photodiode 305 has exceeded a predetermined threshold (that is, the address event has occurred) and generates the detection signal. The address event detection unit 400 performs the handshake with the X arbiter 213 and the Y arbiter 216 when having detected the address event. Note that the address event detection unit 400 is an example of a detection unit described in the claims.

Figure 5A:
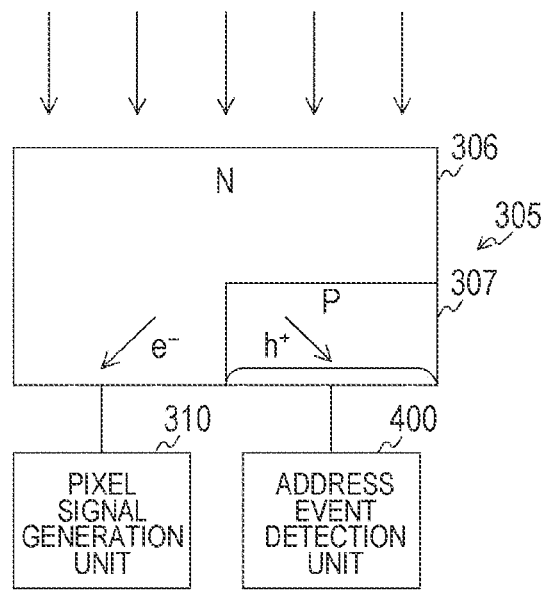
FIGS. 5A and 5B are examples of cross-sectional views of photodiodes in the first embodiment of the present technology and a comparative example.
Figure 5B:
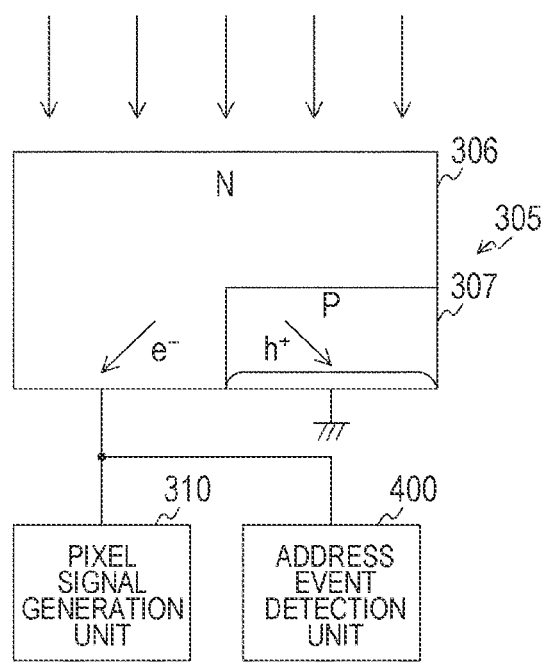

FIGS. 5A and 5B are examples of cross-sectional views of photodiodes 305 in the first embodiment of the present technology and a comparative example. FIG. 5A is an example of a cross-sectional view of the photodiode 305 in the first embodiment, and FIG. 5B is an example of a cross-sectional view of the photodiode 305 in the comparative example.

As illustrated in FIG. 5A, the photodiode 305 includes, for example, an N layer 306 and a P layer 307, and the N layer 306 is connected to the pixel signal generation unit 310 via a cathode electrode. Meanwhile, the P layer 307 is connected to the address event detection unit 400 via an anode electrode.

The photodiode 305 generates electrons and holes by photoelectric conversion. The number of generated electrons becomes larger as the luminance is higher. Furthermore, the number of generated holes is the same as the number of electrons. In FIGS. 5A and 5B, "e−" indicates an electron and "h+" indicates a hole. Of these charges, the electrons are output to the pixel signal generation unit 310 and the holes are output to the address event detection unit 400.

Meanwhile, in the comparative example illustrated in FIG. 5B, both the pixel signal generation unit 310 and the address event detection unit 400 are connected to the cathode, and the anode is grounded. In the comparative example, some of the electrons are output to the pixel signal generation unit 310, and the rest are output to the address event detection unit 400. Furthermore, the holes are discharged to a ground terminal. As described above, in the configuration of the comparative example, only electrons out of the electrons and holes are used for the generation of the pixel signal and the detection of the address event, and the holes are not used for them and are discharged.

In contrast, in the pixel 300 of the first embodiment, the electrons are used to generate the pixel signal and the holes are used to detect the address event. Therefore, as compared with the comparative example using only the electrons, the level of the pixel signal is increased under the same luminance, and the detection accuracy of the address event is improved. This improves the image quality of each of the normal image data and the AER image data. In particular, the image quality can be improved in a dark place with low luminance.

Furthermore, generally, the pixel signal and detection signal generated from electrons have a smaller amount of noise than the case of generating the pixel signal and detection signal from holes. Therefore, the photodiode 305 supplies the electrons to the pixel signal generation unit 310, thereby improving the signal quality of the pixel signal. Meanwhile, since holes are supplied to the address event detection unit 400, the noise amount of the detection signal increases, but the detection signal of the address event is only 2 bits for each pixel, and the influence of the increase in the noise amount is less than the pixel signal.

Note that the cathode of the photodiode 305 is connected to the pixel signal generation unit 310 and the anode is connected to the address event detection unit 400. However, conversely, the cathode can be connected to the address event detection unit 400 and the anode can be connected to the pixel signal generation unit 310.

[Configuration Example of Pixel Signal Generation Unit]

Figure 6:
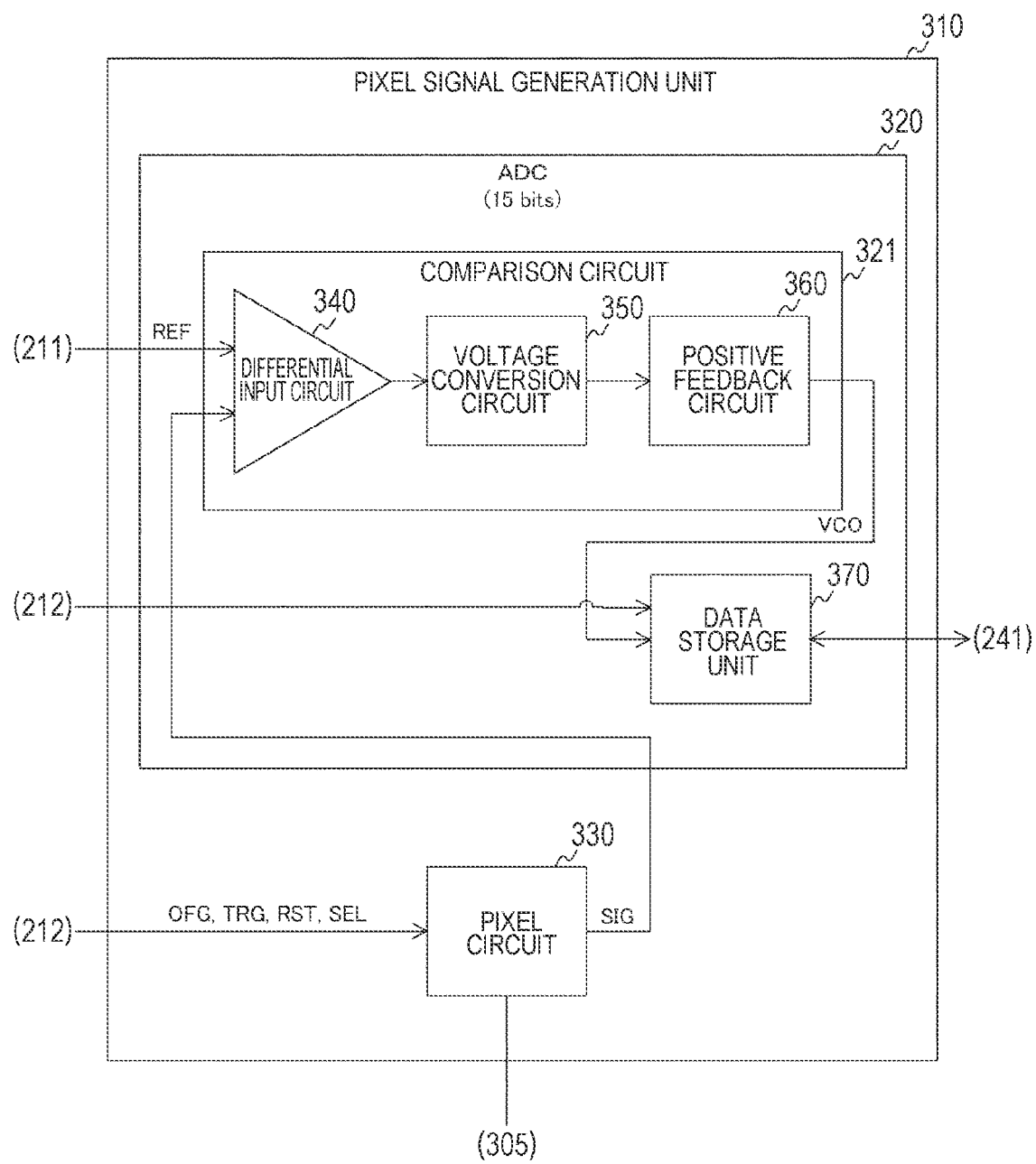
FIG. 6 is a block diagram illustrating a configuration example of a pixel signal generation unit according to the first embodiment of the present technology.

FIG. 6 is a block diagram illustrating a configuration example of the pixel signal generation unit 310 according to the first embodiment of the present technology. The pixel signal generation unit 310 includes an analog-to digital converter (ADC) 320 and a pixel circuit 330. Furthermore, the ADC 320 includes a comparison circuit 321 and a data storage unit 370. Then, the comparison circuit 321 includes a differential input circuit 340, a voltage conversion circuit 350, and a positive feedback circuit 360.

The pixel circuit 330 generates a reset level or a signal level as a pixel signal SIG under the control of the drive circuit 212. Here, the reset level is a voltage of when a floating diffusion layer is initialized at or after the start of exposure, and the signal level is a voltage according to an exposure amount at the end of exposure. The pixel circuit 330 sequentially supplies the reset level and the signal level to the differential input circuit 340.

The ADC 320 performs analog-to-digital (AD) conversion for the pixel signal SIG (reset level or signal level) into a digital signal. Hereinafter, data obtained by AD-converting the reset level will be referred to as "P-phase data". Furthermore, hereinafter, data obtained by AD-converting the signal level will be referred to as "D-phase data".

The differential input circuit 340 in the ADC 320 compares a reference signal REF from the DAC 211 with the pixel signal SIG from the pixel circuit 330. The differential input circuit 340 supplies a comparison result signal indicating the comparison result to the voltage conversion circuit 350.

The voltage conversion circuit 350 converts a voltage of the comparison result signal from the differential input circuit 340 and outputs a conversion result to the positive feedback circuit 360.

The positive feedback circuit 360 adds a part of an output to an input (comparison result signal) and outputs the comparison result signal as an output signal VCO to the data storage unit 370.

The data storage unit 370 stores a time code of when the output signal VCO is inverted. The data storage unit 370 outputs the time code corresponding to the reset level as the P-phase data and outputs the time code corresponding to the signal level as the D-phase data under the control of the drive circuit 212.

[Configuration Example of Address Event Detection Unit]

Figure 7:
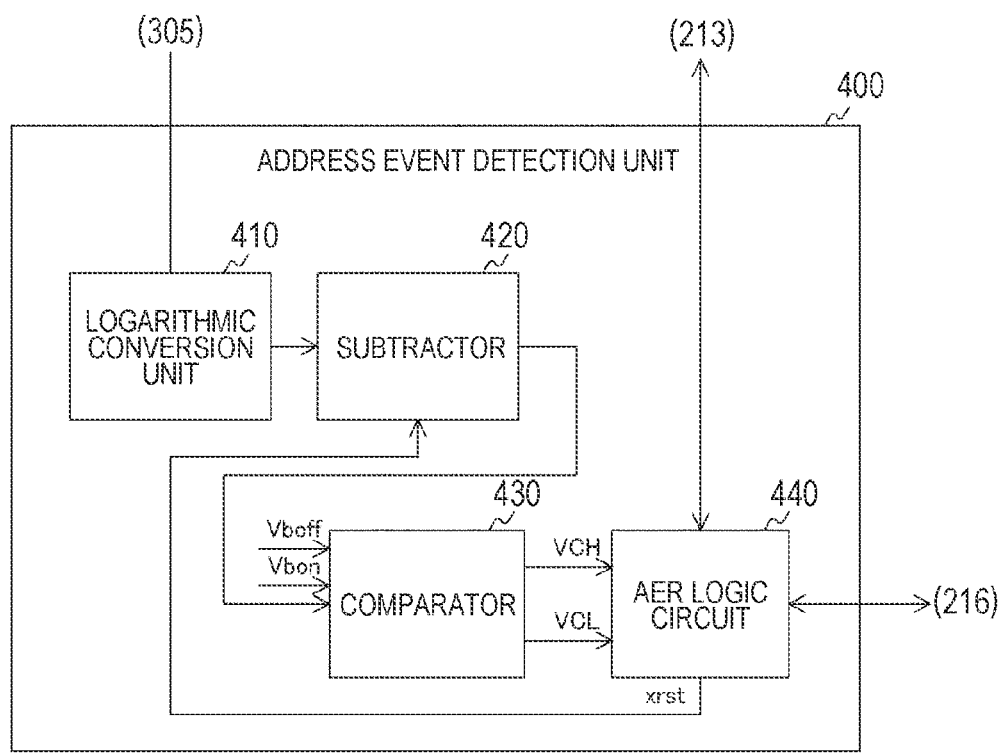
FIG. 7 is a block diagram illustrating a configuration example of an address event detection unit according to the first embodiment of the present technology.

FIG. 7 is a block diagram illustrating a configuration example of the address event detection unit 400 according to the first embodiment of the present technology. The address event detection unit 400 includes a logarithmic conversion unit 410, a subtractor 420, a comparator 430, and an AER logic circuit 440.

The logarithmic conversion unit 410 logarithmically converts a photocurrent, which includes the charges (holes and the like) generated by the photodiode 305, into a voltage. The logarithmic conversion unit 410 supplies a converted voltage signal to the subtractor 420. Note that the logarithmic conversion unit 410 is an example of a conversion unit described in the claims.

The subtractor 420 obtains a change amount in the voltage signal by subtraction operation. The subtractor 420 supplies a differential signal indicating the change amount to the comparator 430. Furthermore, the differential signal is initialized by a reset signal xrst.

The comparator 430 compares the differential signal from the subtractor 420 with each of an upper limit threshold Vbon and a lower limit threshold Vboff. The comparator 430 outputs a comparison result between the differential signal and the upper limit threshold Vbon as an on-event detection result VCH to the AER logic circuit 440. Furthermore, the comparator 430 outputs a comparison result between the differential signal and the lower limit threshold Vboff as an off-event detection result VCL to the AER logic circuit 440.

The AER logic circuit 440 performs the handshake on the basis of the detection signal including the detection results VCH and VCL. The AER logic circuit 440 performs the handshake with the Y arbiter 216 in a case where the address event has occurred. Next, the AER logic circuit 440 performs the handshake with the X arbiter 213 and resets the subtractor 420 using the reset signal xrst upon receiving a response.

Figure 8:
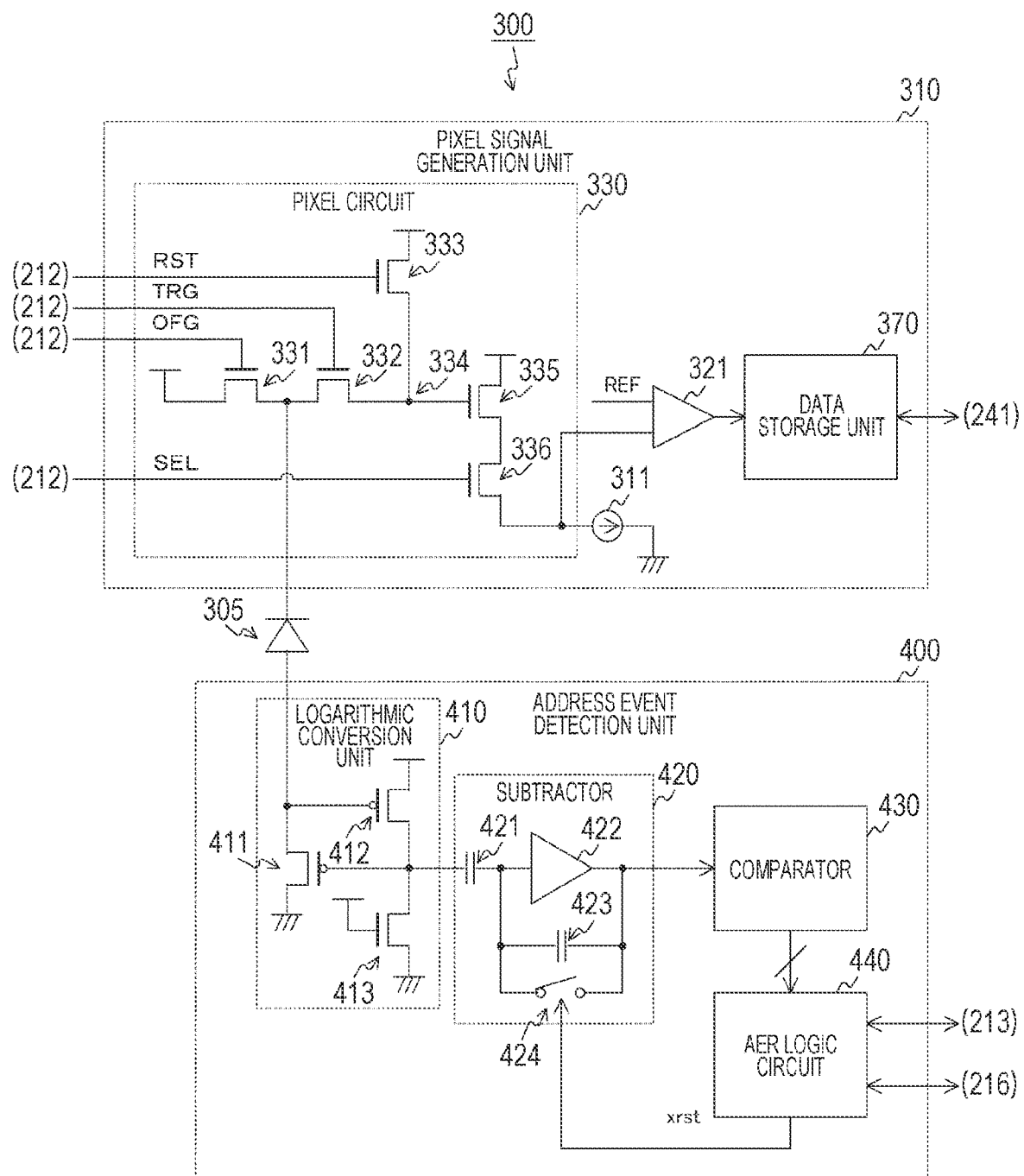
FIG. 8 is a circuit diagram illustrating a configuration example of a pixel according to the first embodiment of the present technology.

FIG. 8 is a circuit diagram illustrating a configuration example of the pixel 300 according to the first embodiment of the present technology. The pixel signal generation unit 310 includes the pixel circuit 330, a load MOS circuit 311, the comparison circuit 321, and the data storage unit 370. Furthermore, the pixel circuit 330 includes a discharge transistor 331, a transfer transistor 332, a reset transistor 333, a floating diffusion layer 334, an amplification transistor 335, and a selection transistor 336. As the discharge transistor 331, the transfer transistor 332, the reset transistor 333, the amplification transistor 335, and the selection transistor 336, N-type metal oxide semiconductor (NMOS) transistors are used, for example. Furthermore, the discharge transistor 331 and the transfer transistor 332 are connected to the cathode of the photodiode 305.

The discharge transistor 331 discharges the charge (electrons and the like) of the photodiode 305 according to a drive signal OFG from the drive circuit 212.

The transfer transistor 332 transfers the charge from the photodiode 305 to the floating diffusion layer 334 according to a transfer signal TRG from the drive circuit 212.

The reset transistor 333 initializes the charge amount of the floating diffusion layer 334 according to a reset signal RST from the drive circuit 212.

The floating diffusion layer 334 accumulates the transferred charge and generates a voltage according to the charge amount. The amplification transistor 335 amplifies the voltage of the floating diffusion layer 334.

The selection transistor 336 supplies a signal of the amplified voltage as the pixel signal SIG to the comparison circuit 321 according to a selection signal SEL from the drive circuit 212.

The load MOS circuit 311 is inserted between a source of the selection transistor 336 and the ground terminal.

The drive circuit 212 initializes the floating diffusion layer 334 according to the reset signal RST at the start of exposure for all the pixels in synchronization with the vertical synchronization signal VSYNC, and transfers the charge according to a transfer signal TRG at the end of exposure. In other words, a global shutter system is used. Furthermore, the drive circuit 212 sequentially selects the rows according to the selection signal SEL and outputs the pixel signals.

Furthermore, the address event detection unit 400 includes the logarithmic conversion unit 410, the subtractor 420, the comparator 430, and the AER logic circuit 440. The logarithmic conversion unit 410 includes P-type metal oxide semiconductor (PMOS) transistors 411 and 412 and an NMOS transistor 413. The subtractor 420 includes capacitors 421 and 423, an amplifier 422, and a switch 424.

In the logarithmic conversion unit 410, a source of the PMOS transistor 411 is connected to the anode of the photodiode 305, and a drain of the PMOS transistor 411 is grounded. Furthermore, the PMOS transistor 412 and the NMOS transistor 413 are connected in series between a power supply terminal and the ground terminal, and a gate of the PMOS transistor 412 is connected to the anode of the photodiode 305. Furthermore, a gate of the PMOS transistor 411 is connected to a connection point of the PMOS transistor 412 and the NMOS transistor 413, and a gate of the NMOS transistor 413 is connected to the power supply terminal. The photocurrent from the photodiode 305 is logarithmically converted into a voltage signal by the PMOS transistors 411 and 412 connected in a loop manner, and the voltage signal is output from the connection point of the PMOS transistor 412 and the NMOS transistor 413.

In the subtractor 420, one end of the capacitor 421 is connected to an output terminal of the logarithmic conversion unit 410, and the other end of the capacitor 421 is connected to an input terminal of the amplifier 422. The capacitor 423 is connected to the amplifier 422 in parallel. The switch 424 opens or closes a path connecting both ends of the capacitor 423 according to the reset signal xrst.

The amplifier 422 amplifies the voltage signal input via the capacitor 421. The amplifier 422 outputs the amplified signal to the comparator 430.

When the switch 424 is turned on, a voltage signal $V_{init}$ is input to the logarithmic conversion unit 410 side of the capacitor 421, and an opposite side becomes a virtual ground terminal. A potential of this virtual ground terminal is set to zero for convenience. At this time, a potential $Q_{init}$ accumulated in the capacitor 421 is expressed by the following expression, where C1 is a capacitance of the capacitor 421. Meanwhile, since both ends of the capacitor 423 are short-circuited, the accumulated charge is zero.

$$Q_{init}=C1 \times V_{init} \qquad \text{Expression 1}$$

Next, considering a case where the switch 424 is turned off and the voltage on the input side of the capacitor 421 changes to $V_{after}$, a charge $Q_{after}$ accumulated in the capacitor 421 is expressed by the following expression.

$$Q_{after}=C1 \times V_{after} \qquad \text{Expression 2}$$

Meanwhile, a charge Q2 accumulated in the capacitor 423 is expressed by the following expression, where an output voltage is Vout.

$$Q2=-C2 \times V\text{out} \qquad \text{Expression 3}$$

At this time, a total charge amount of the capacitors 421 and 423 does not change, and therefore the following expression holds.

$$Q_{init}=Q_{after}+Q2 \qquad \text{Expression 4}$$

By substituting Expressions 1 to 3 into Expression 4 and transforming the expression, the following expression is obtained.

$$V\text{out}=-(C1/C2) \times (V_{after}-V_{init}) \qquad \text{Expression 5}$$

The expression 5 expresses a subtraction operation of the voltage signal, and a gain of the subtraction result is C1/C2. Since it is usually desired to maximize the gain, it is favorable to design C1 large and C2 small. Meanwhile, if C2 is too small, kTC noise increases, and noise characteristics may deteriorate. Therefore, the capacitance reduction of C2 is limited to a range where noise is tolerable. Furthermore, since the address event detection unit 400 including the subtractor 420 is mounted for each pixel, there is a restriction on the area of the capacitances C1 and C2. Taking the above points into consideration, for example, C1 is set to a value of 20 to 200 femtofarads (fF), and C2 is set to a value of 1 to 20 femtofarads (fF).

[Operation Example of Solid-State Image Sensor]

Figure 9:
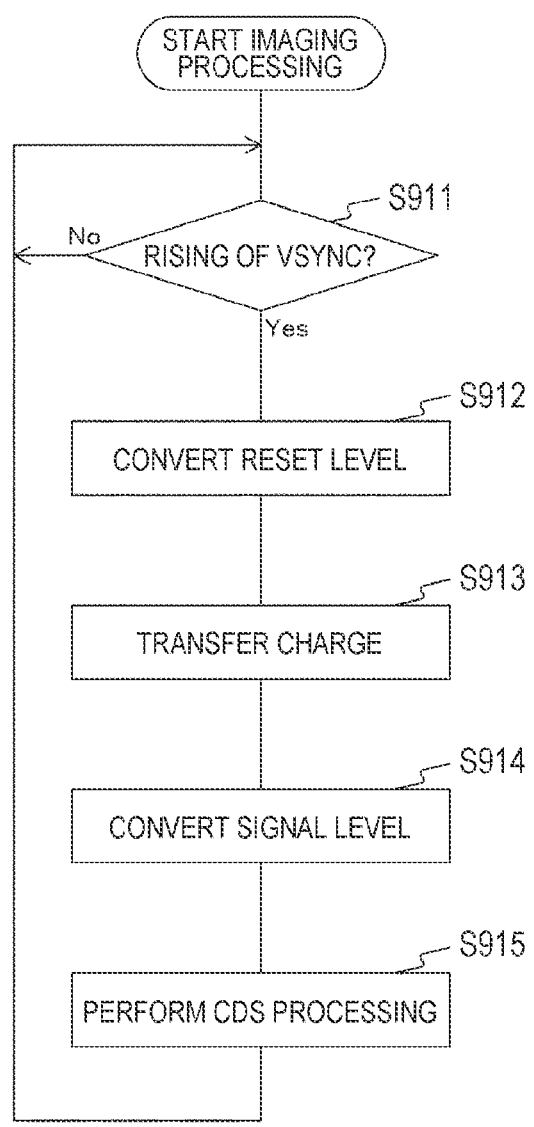
FIG. 9 is a flowchart illustrating an example of imaging processing according to the first embodiment of the present technology.

FIG. 9 is a flowchart illustrating an example of imaging processing according to the first embodiment of the present technology. This imaging processing is started when, for example, an application for imaging the normal image data is executed.

The solid-state image sensor 200 determines whether or not it is timing of rising edge of the VSYNC (step S911). In the case where it is the timing of rising edge of the VSYNC (step S911: Yes), each of the pixels in the solid-state image sensor 200 converts the reset level into the P-phase data immediately before the end of exposure (step S912). Then, the pixel transfers the charge to the FD at the end of exposure (step S913) and converts the signal level into the D-phase data (step S914). Then, the solid-state image sensor 200 executes CDS processing (step S915). In the case where it is before the timing of rising edge of the VSYNC (step S911: No) or after step S915, the solid-state image sensor 200 repeatedly executes step S911 and the subsequent steps.

Figure 10:
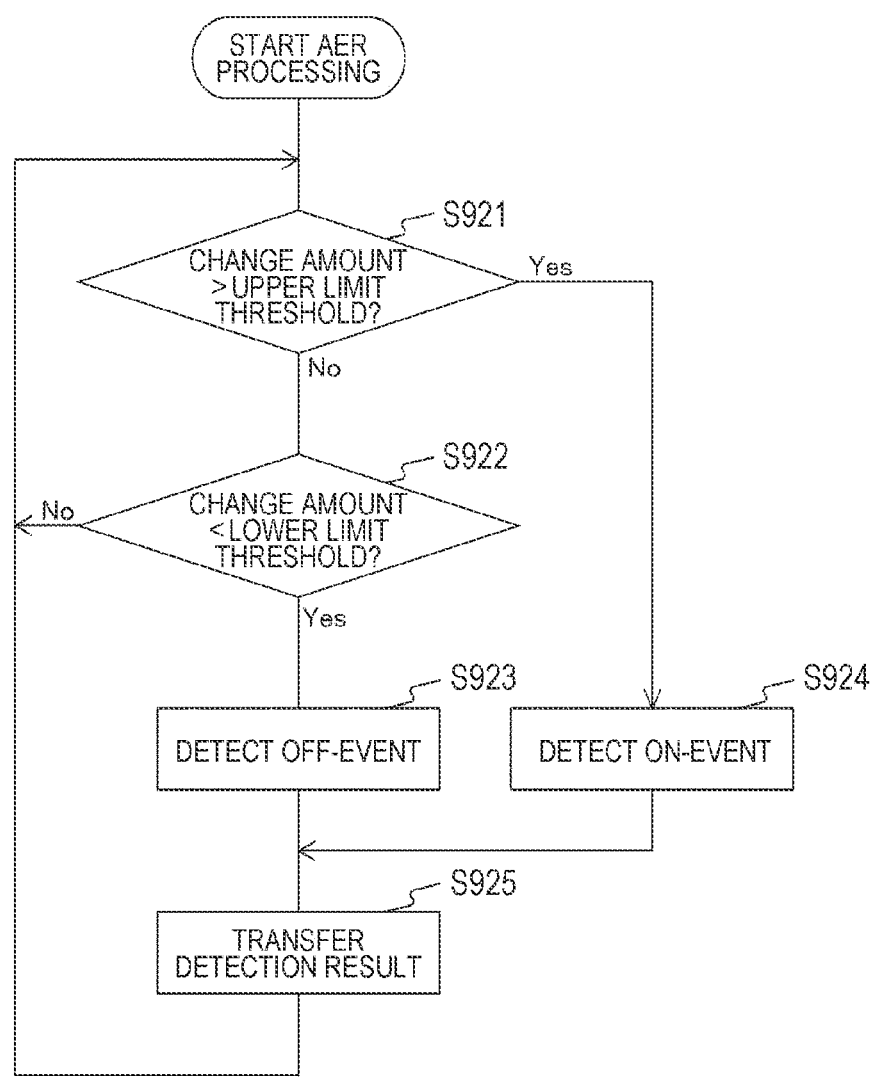
FIG. 10 is a flowchart illustrating an example of address event representation (AER) processing according to the first embodiment of the present technology.

FIG. 10 is a flowchart illustrating an example of AER processing according to the first embodiment of the present technology. The AER processing is started when, for example, an application for AER is executed.

The pixel 300 in the solid-state image sensor 200 determines whether or not the change amount in luminance has exceeded the upper limit threshold (step S921). In the case where the change amount is less than or equal to the upper limit threshold (step S921: No), the pixel 300 determines whether or not the change amount in luminance has fallen below the lower limit threshold (step S922). In the case where the change amount is less than the lower limit threshold (step S922: Yes), the pixel 300 detects an off-event (step S923). On the other hand, in the case where the change amount has exceeded the upper limit threshold (step S921: Yes), the pixel 300 detects an on-event (step S924).

After step S923 or S924, the pixel 300 transfers the detection result of the address event by handshake (step S925) and repeatedly executes step S921 and the subsequent steps. Furthermore, in the case where the change amount is larger than or equal to the lower limit threshold (step S922: No), the pixel 300 repeatedly executes step S921 and the subsequent steps.

As described above, according to the first embodiment of the present technology, the pixel signal generation unit 310 generates the pixel signal from the electrons, and the address event detection unit 400 detects the address event from the holes. Therefore, the image quality of the image data can be improved as compared with the case where only the electrons are used.

2. Second Embodiment

In the above-described first embodiment, the pixels 300 are arranged on the single semiconductor chip. However, the circuit scale of the semiconductor chip may increase as the number of pixels increases. A solid-state image sensor 200 according to a second embodiment is different from that in the first embodiment in arranging circuits in a pixel 300 on a plurality of stacked semiconductor chips in a distributed manner.

Figure 11:
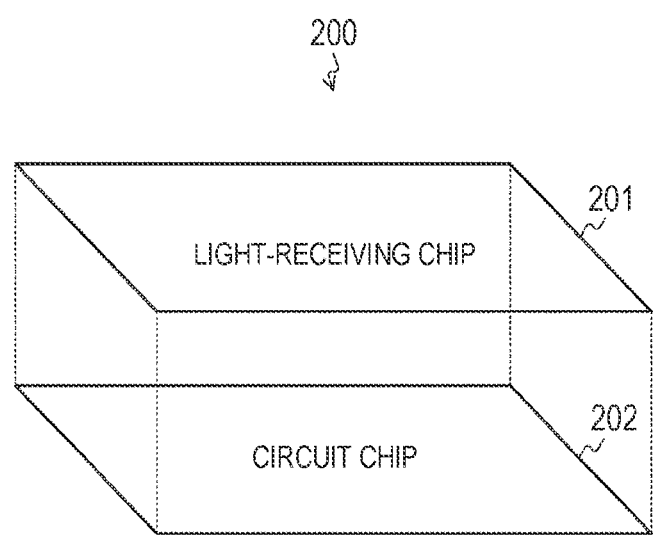
FIG. 11 is a diagram illustrating an example of a stacked structure according to a second embodiment of the present technology.

FIG. 11 is a diagram illustrating an example of a stacked structure of the solid-state image sensor 200 according to the first embodiment of the present technology. The solid-state image sensor 200 includes a circuit chip 202 and a light-receiving chip 201 stacked on the circuit chip 202. These chips are electrically connected via a connection part such as a via. Note that Cu—Cu bonding or bump can be used for connection in addition to the via.

Figure 12:
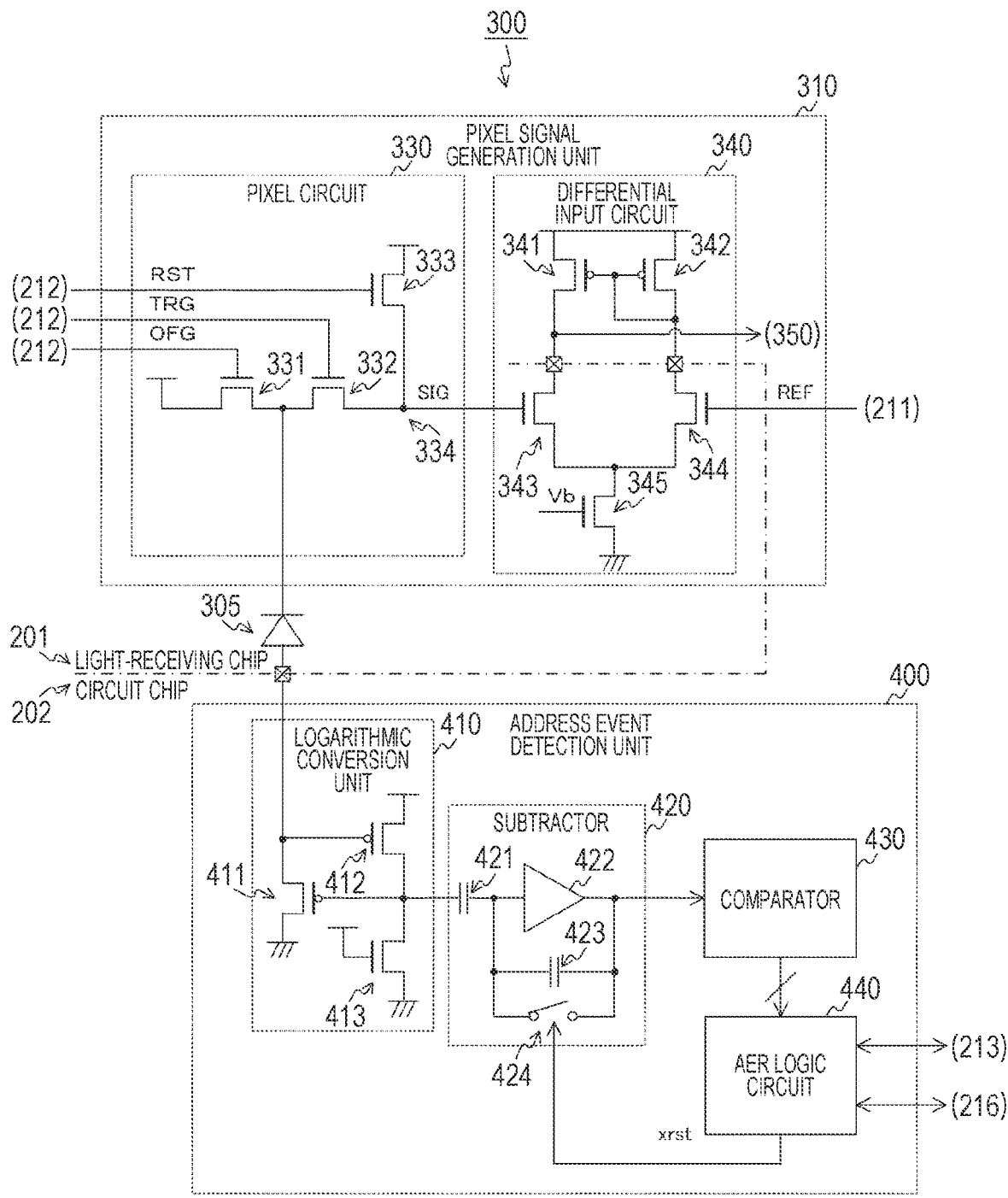
FIG. 12 is a circuit diagram illustrating a configuration example of a pixel according to the second embodiment of the present technology.

FIG. 12 is a circuit diagram illustrating a configuration example of the pixel 300 according to the second embodiment of the present technology. In the pixel 300 according to the second embodiment, a pixel circuit 330 does not include an amplification transistor 335 and a selection transistor 336, and a voltage signal of a floating diffusion layer 334 is directly input to a differential input circuit 340 in a comparison circuit 321 as a pixel signal SIG.

Furthermore, the differential input circuit 340 includes PMOS transistors 341 and 342 and NMOS transistors 343 to 345.

The PMOS transistor 341 and the NMOS transistor 343 are connected in series between a power supply terminal and a drain of the NMOS transistor 345. The PMOS transistor 342 and the NMOS transistor 344 are connected in series between the power supply terminal and the drain of the NMOS transistor 345.

Furthermore, a gate of the PMOS transistor 342 is connected to a gate of the PMOS transistor 341 and the drain of the PMOS transistor 342 itself. The pixel signal SIG from the pixel circuit 330 is input to a gate of the NMOS transistor 343, and a reference signal REF from a DAC 211 is input to a gate of the NMOS transistor 344. Furthermore, a connection point of the PMOS transistor 341 and the NMOS transistor 343 is connected to a voltage conversion circuit 350.

In the above-described circuit configuration, the pixel circuit 330 and the NMOS transistors 343 to 345 in the differential input circuit 340 are arranged on the light-receiving chip 201. Furthermore, the PMOS transistors 341 and 342 in the differential input circuit 340, a circuit at a subsequent stage, and an address event detection unit 400 are arranged on the circuit chip 202. The DAC 211, a drive circuit 212, an X arbiter 213, a time code generation unit 230, a column processing unit 250, a control circuit 215, and a Y arbiter 216 in the solid-state image sensor 200 are arranged on the circuit chip 202.

Note that the circuits and elements in the solid-state image sensor 200 are arranged on the two chips (light-receiving chip 201 and circuit chip 202) in a distributed manner. However, the circuits and elements can be arranged on three or more stacked chips in a distributed manner.

As described above, according to the second embodiment of the present technology, the circuits in the solid-state image sensor 200 are distributed and arranged on the light-receiving chip 201 and the circuit chip 202. Therefore, the circuit scales of the chips can be reduced as compared with the case of arranging the circuits on the single chip.

[Modification]

In the above-described second embodiment, the pixel circuit 330 and the NMOS transistors 343 to 345 in a comparison circuit 321 are arranged on the light-receiving chip 201. However, the circuit scale of the light-receiving chip 201 may increase as the number of pixels increases. A solid-state image sensor 200 according to a modification of the second embodiment is different from that of the second embodiment in arranging a pixel circuit 330 on a light-receiving chip 201 and the whole of a comparison circuit 321 is arranged on a circuit chip 202.

Figure 13:
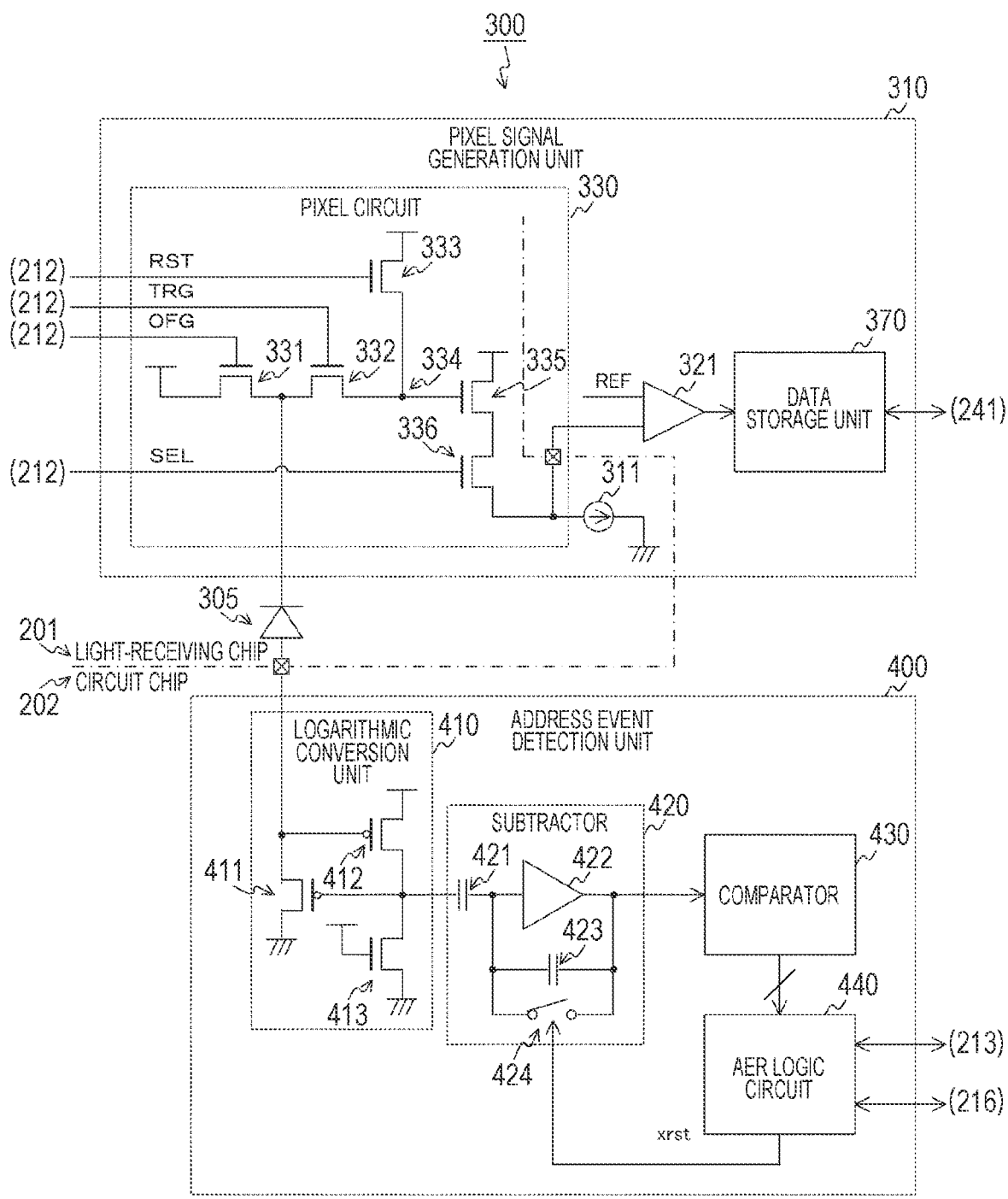
FIG. 13 is a circuit diagram illustrating a configuration example of a pixel according to a modification of the second embodiment of the present technology.

FIG. 13 is a circuit diagram illustrating a configuration example of the pixel 300 according to the modification of the second embodiment of the present technology. In the modification of the second embodiment, the pixel circuit 330 includes an amplification transistor 335 and a selection transistor 336, similarly to the first embodiment.

Furthermore, the pixel circuit 330 and a load MOS circuit 311 are arranged on the light-receiving chip 201, and the comparison circuit 321 and the like other than the pixel circuit 330 and the load MOS circuit 311 are arranged on the circuit chip 202.

As described above, in the modification of the second embodiment of the present technology, the pixel circuit 330 is arranged on the light-receiving chip 201, and the whole of the comparison circuit 321 is arranged on the circuit chip 202. Therefore, the circuit scale of the light-receiving chip 201 can be reduced as compared with the second embodiment.

3. Third Embodiment

In the above-described first embodiment, the pixel signals of all the pixels are read in synchronization with the vertical synchronization signal VSYNC. However, the circuit scale may increase as the number of pixels increases, and power consumption may increase. A solid-state image sensor 200 according to a third embodiment is different from that of the first embodiment in reading only a pixel signal of a pixel in which an address event has occurred.

Figure 14:
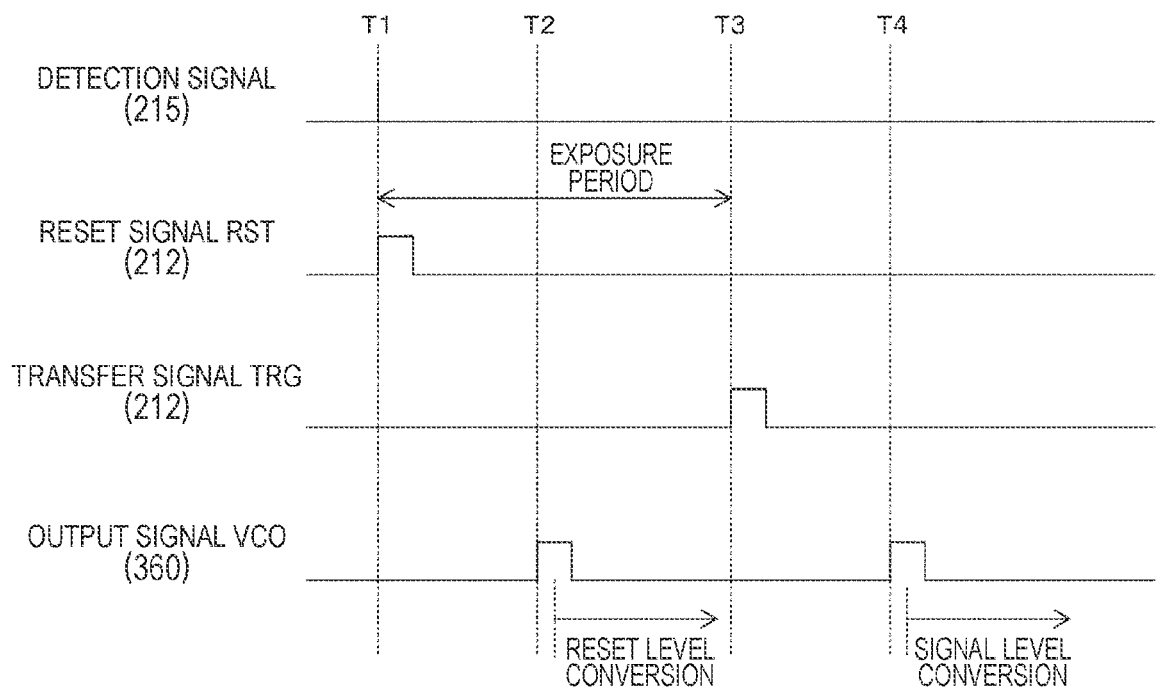
FIG. 14 is a timing chart illustrating an example of a method of driving a pixel according to a third embodiment of the present technology.

FIG. 14 is a timing chart illustrating an example of a method of driving a pixel 300 according to the third embodiment of the present technology. A control circuit 215 supplies an address event detection signal to a drive circuit 212. A vertical synchronization signal VSYNC is not input to the solid-state image sensor 200. Furthermore, the drive circuit 212 drives only a pixel in which an address event has occurred among all of pixels to generate a pixel signal. Then, only the pixel signal of the pixel in which the address event has occurred is read out.

For example, at timing T1, the detection signal of a certain pixel 300 is assumed to be output by the control circuit 215. The drive circuit 212 supplies a reset signal RST to the pixel 300 and starts exposure. Then, at timing T2 immediately before the end of exposure, an output signal VCO is output from a comparison circuit 321 and AD conversion (in other words, readout) of a reset level is started.

At timing T3 at the end of exposure, the drive circuit 212 supplies a transfer signal TRG. At timing T4 immediately after the timing T3, the output signal VCO is output from the comparison circuit 321, and the AD conversion (readout) of a signal level is started.

Note that the solid-state image sensor 200 reads the pixel signal of one pixel when an address event has occurred. However, the solid-state image sensor 200 can read respective pixel signals of a plurality of pixels. For example, a pixel array unit 240 is divided into pixel blocks having a certain size, each pixel block including a plurality of pixels, and when the address event has occurred in a certain pixel block, the plurality of pixel signals in the block may be read.

As described above, according to the third embodiment of the present technology, the solid-state image sensor 200 reads only the pixel signal of the pixel in which the address event has occurred among all the pixels. Therefore, the power consumption of the solid-state image sensor 200 can be reduced as compared with the case of reading all the pixels. Furthermore, a reading speed can be increased as compared with the case of reading all the pixels.

[First Modification]

In the above-described third embodiment, only the pixel in which the address event has occurred is exposed and read among all the pixels, but if the exposure timing differs for each pixel, the output timing of the pixel signal varies from pixel to pixel. A solid-state image sensor 200 according to a first modification of the third embodiment is different from that of the third embodiment in exposing all of pixels and outputting only a pixel signal of a pixel in which an address event has occurred.

Figure 15:
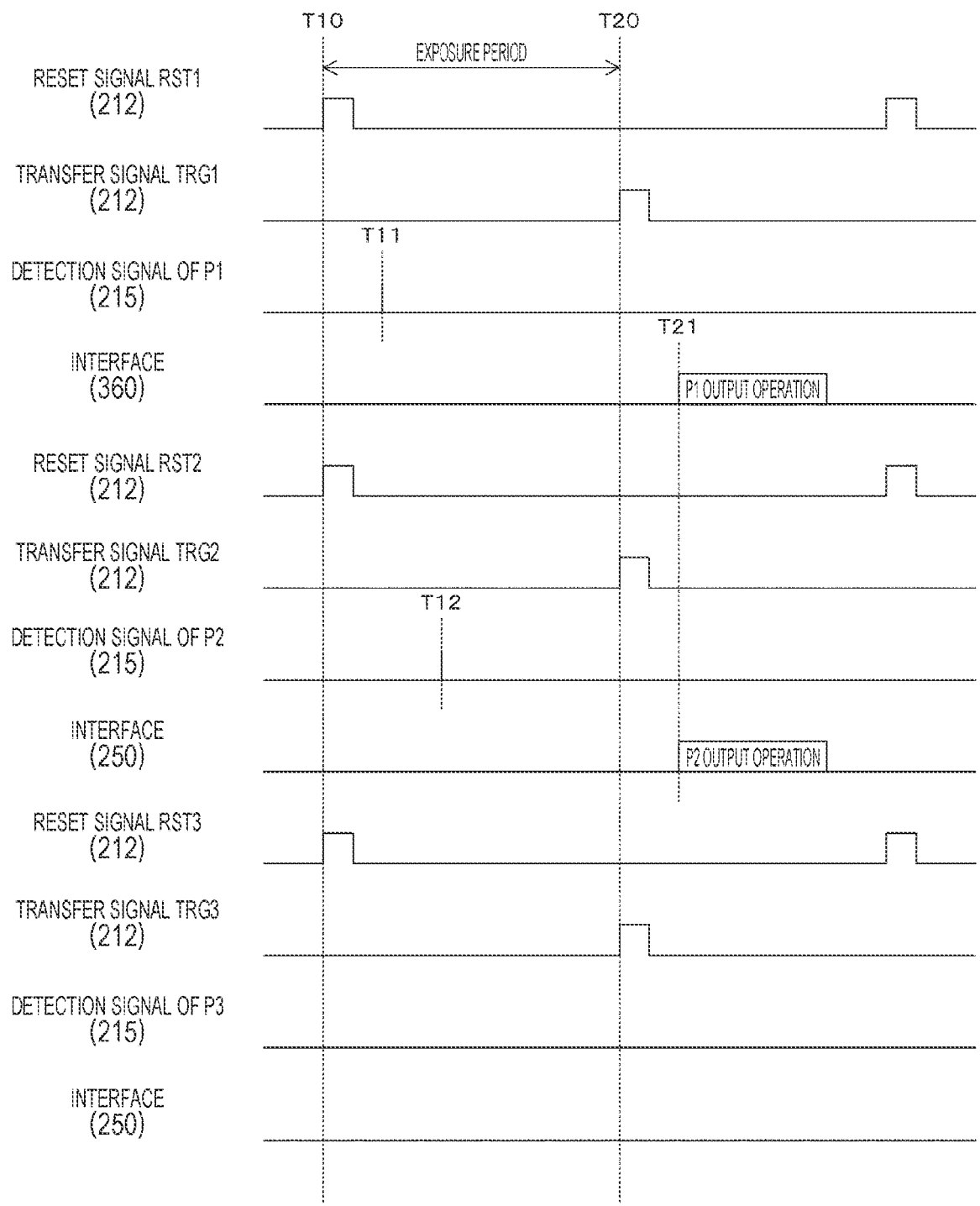
FIG. 15 is a timing chart illustrating an example of a method of driving a pixel according to a first modification of the third embodiment of the present technology.

FIG. 15 is a timing chart illustrating an example of a method of driving a pixel 300 according to the first modification of the third embodiment of the present technology. A drive circuit 212 simultaneously exposes all of pixels in synchronization with a vertical synchronization signal VSYNC. In other words, a global shutter system is used.

For example, at timing T10 of the start of exposure, the drive circuit 212 supplies reset signals RSTn such as RST1, RST2, and RST3 to all the pixels. RSTn (n is an integer) is supplied to a pixel Pn. Then, at timing T20 of the end of exposure, the drive circuit 212 supplies transfer signal TRGn to all the pixels. As a result, all the pixels are exposed at the same time.

Then, in an exposure period from timings T10 to T20, the drive circuit 212 controls a column processing unit 250 to output the pixel signal for the pixel in which an address event has occurred.

For example, it is assumed that, at timings T11 and T12, the detection signals of pixels P1 and P2 are output by the control circuit 215 and the detection signal of a pixel P3 is not output. In this case, the drive circuit 212 causes the column processing unit 250 to output the pixel signals of the pixels P1 and P2 at timing T21 immediately after the end of exposure. Thereby, output timings of the pixels P1 and P2 can be made coincide with timing synchronized with a vertical synchronization signal VSYNC.

As described above, according to the first modification of the third embodiment of the present technology, the drive circuit 212 exposes all the pixels and outputs only the pixel signals of the pixels in which the address event has occurred. Therefore, the output timings of the pixel signals of the pixels can made coincide with each other.

[Second Modification]

In the above-described third embodiment, the ADC 320 is provided for each pixel, and only the pixel signal of the pixel in which the address event has occurred is AD-converted (in other words, is read). However, in the configuration having the ADC 320 arranged for each pixel, the circuit scale of the pixel 300 increases. A solid-state image sensor 200 according to a second modification of the third embodiment is different from that of the third embodiment in that an ADC is arranged for each column.

Figure 16:
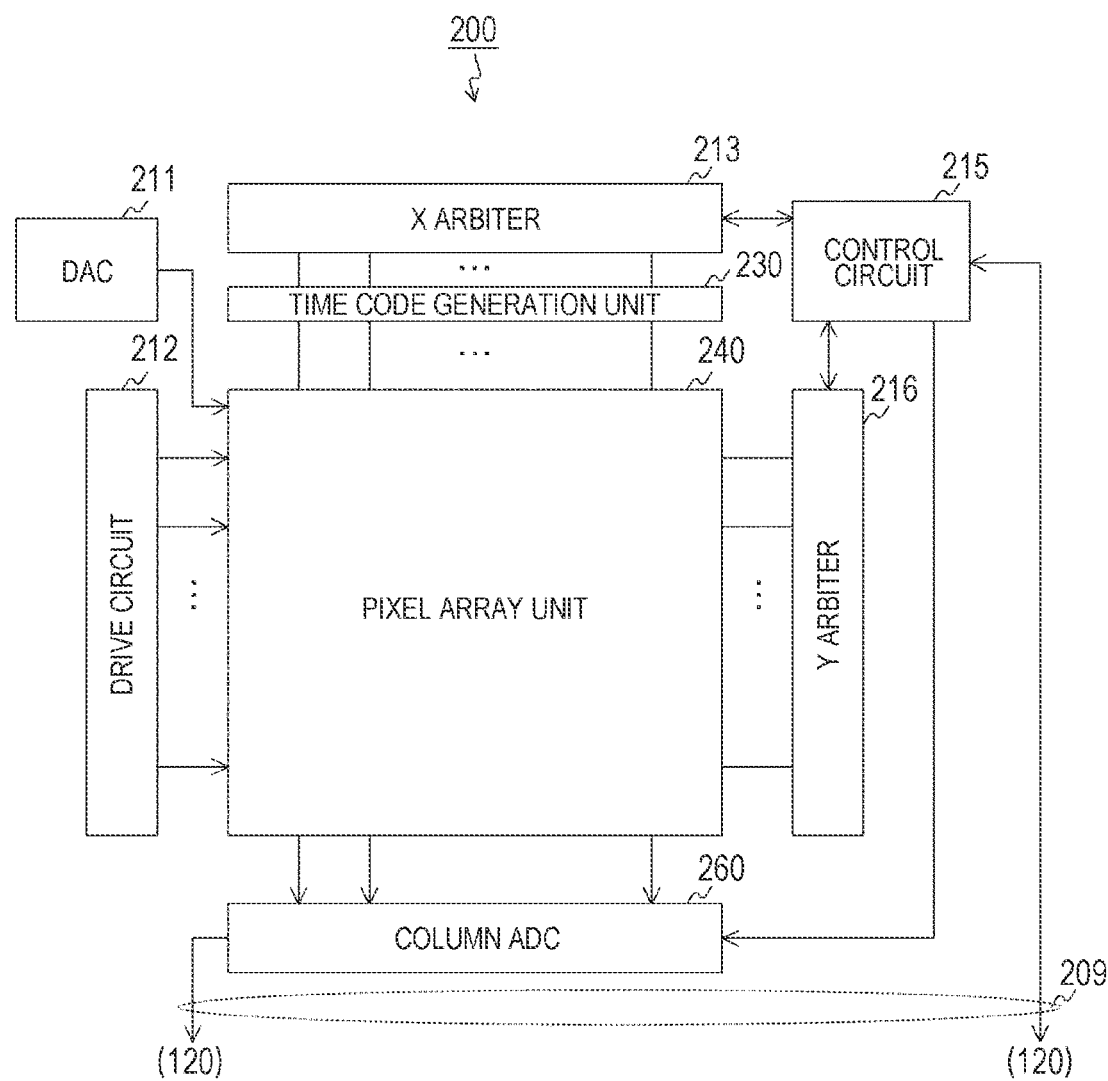
FIG. 16 is a block diagram illustrating a configuration example of a solid-state image sensor according to a second modification of the third embodiment of the present technology.

FIG. 16 is a block diagram illustrating a configuration example of the solid-state image sensor 200 according to the second modification of the third embodiment of the present technology. The solid-state image sensor 200 according to the second modification of the third embodiment is different from that of the third embodiment in including a column ADC 260 instead of a column processing unit 250. The column ADC 260 is provided with an ADC for each column.

Furthermore, in the second modification of the third embodiment, a control circuit 215 controls the column ADC 260 to AD-convert only a pixel signal from a column in which an address event has occurred.

Figure 17:
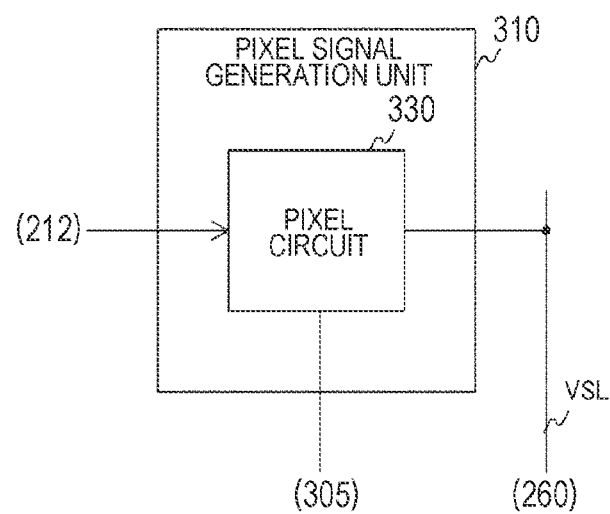
FIG. 17 is a block diagram illustrating a configuration example of a pixel according to the second modification of the third embodiment of the present technology.

FIG. 17 is a block diagram illustrating a configuration example of a pixel 300 according to the second modification of the third embodiment of the present technology. The pixel 300 of the second modification of the third embodiment is different from that of the third embodiment in that an ADC 320 is not provided. A pixel circuit 330 supplies an analog pixel signal to the column ADC 260 via a vertical signal line VSL wired for each column.

As described above, according to the second modification of the third embodiment of the present technology, the ADC is arranged for each column. Therefore, the circuit scale of the pixel 300 can be reduced as compared with the case of arranging the ADC for each pixel.

4. Fourth Embodiment

In the above-described first embodiment, the pixel 300 AD-converts the pixel signal after the end of exposure. Since noise occurs due to the initialization of the photodiode 305, the next exposure cannot be started during the AD conversion. A pixel 300 according to a fourth embodiment is different from that of the first embodiment in adding an analog memory and a transfer transistor to enable start of exposure during AD conversion.

Figure 18:
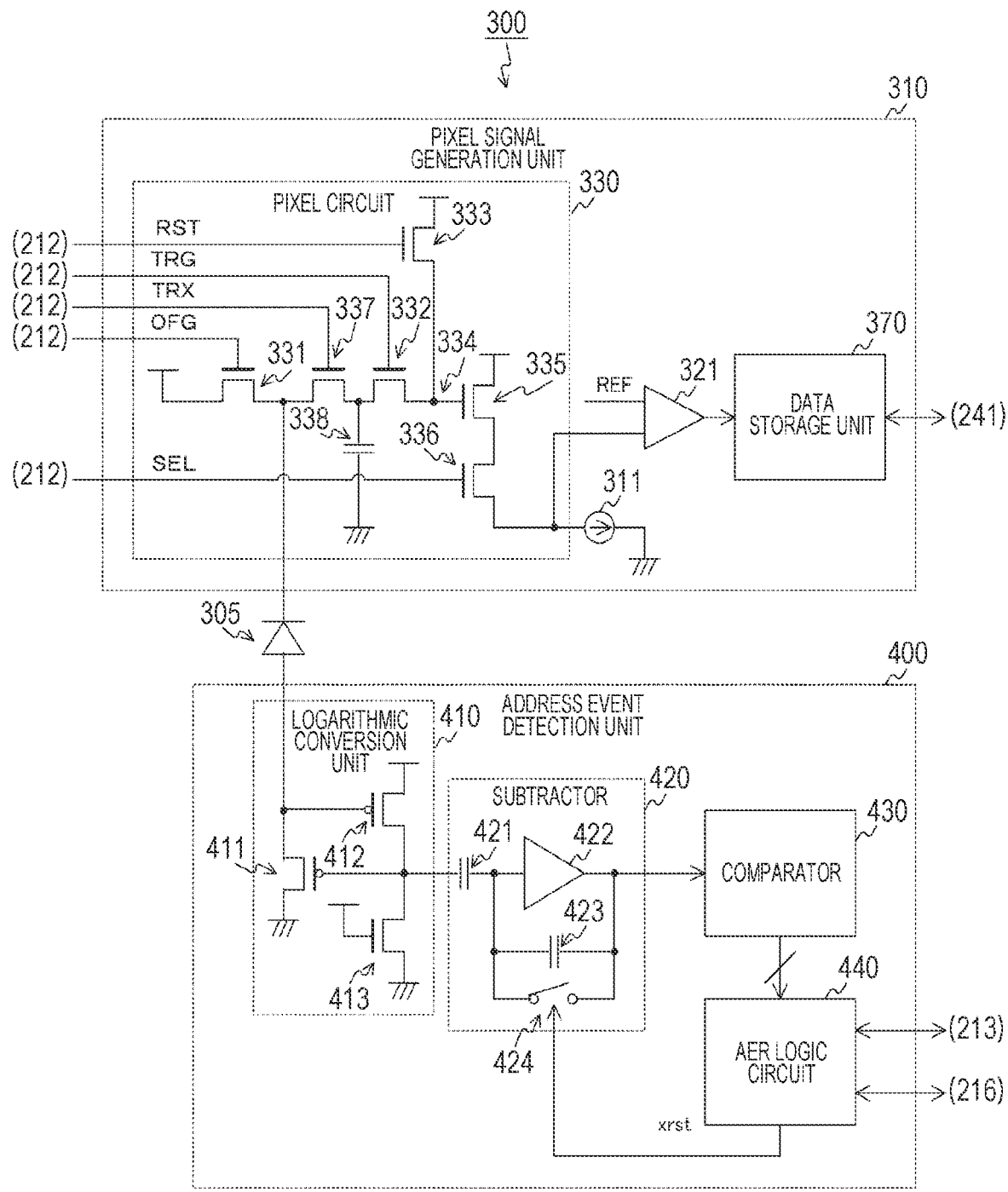
FIG. 18 is a circuit diagram illustrating a configuration example of a pixel according to a fourth embodiment of the present technology.

FIG. 18 is a circuit diagram illustrating a configuration example of the pixel 300 according to the fourth embodiment of the present technology. The pixel 300 of the fourth embodiment is different from that of the first embodiment in further including a transfer transistor 337 and an analog memory 338. As the transfer transistor 337, an NMOS transistor is used, for example.

The transfer transistor 337 transfers a charge from a photodiode 305 to the analog memory 338 according to a transfer signal TRX from a drive circuit 212. Note that the transfer transistor 337 is an example of a first transfer transistor described in the claims, and the transfer transistor 332 is an example of a second transfer transistor described in the claims.

The analog memory 338 stores charges. In principle, the analog memory 338 can be formed using a wiring capacitor. However, it is desirable to use a buried-type capacitor capable of complete depletion to enable charge transfer to a floating diffusion layer 334. Note that the analog memory 338 is an example of a charge accumulation unit described in the claims.

When an exposure period ends, the drive circuit 212 transfers the charge from the photodiode 305 to the analog memory 338 according to the transfer signal TRX, and initializes the floating diffusion layer 334 according to a reset signal RST. An ADC 320 starts AD conversion for a reset level.

Furthermore, when the AD conversion for the reset level ends, the drive circuit 212 transfers the charge from the analog memory 338 to the floating diffusion layer 334 according to a transfer signal TRG. The ADC 320 starts AD conversion for a signal level.

As described above, since the charge of the photodiode 305 is transferred to the analog memory 338 before the AD conversion, the drive circuit 212 can start the next exposure using a drive signal OFG during the AD conversion.

As described above, according to the fourth embodiment of the present technology, since the transfer transistor 337 transfers the charge from the photodiode 305 to the analog memory 338 when the exposure period ends, the next exposure can be started during the AD conversion.

5. Fifth Embodiment

In the above-described first embodiment, the logarithmic conversion unit 410 supplies the voltage signal to the subtractor 420. However, in the configuration, drive force of the circuits of and after the subtractor 420 may be insufficient. An address event detection unit 400 according to a fifth embodiment is different from that of the first embodiment in arranging a buffer 450 to improve drive force.

Figure 19:
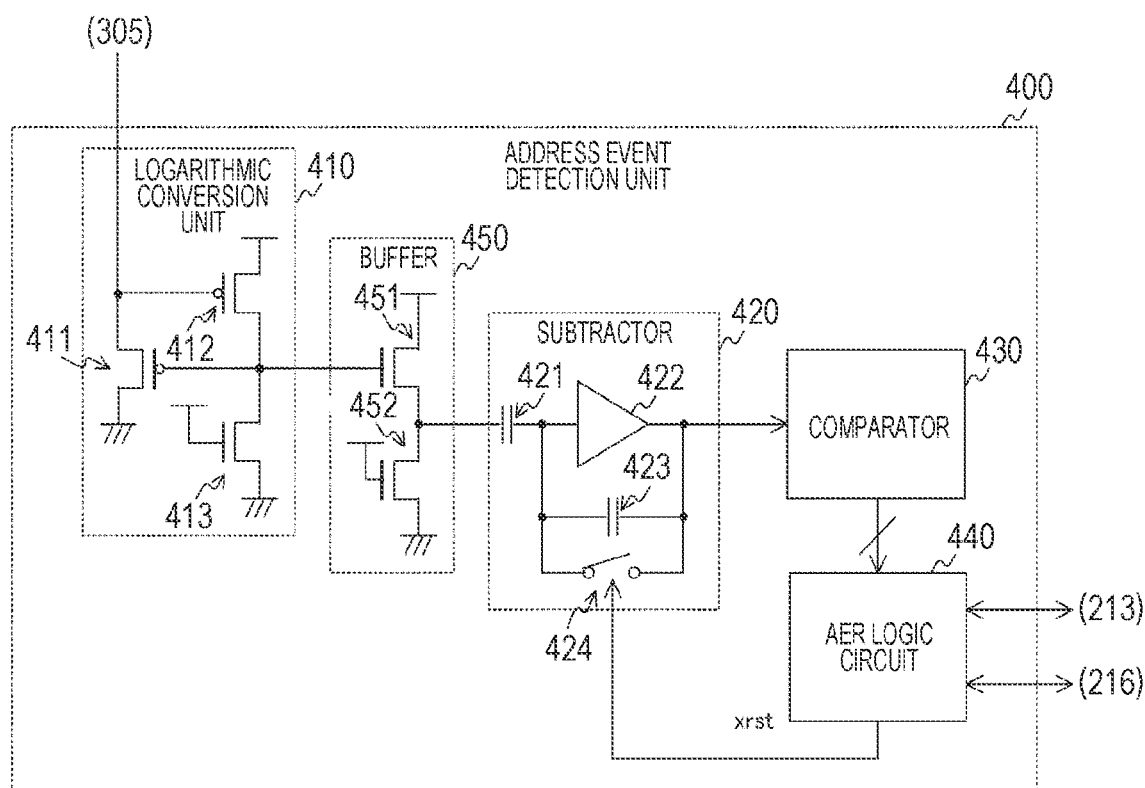
FIG. 19 is a circuit diagram illustrating a configuration example of an address event detection unit according to a fifth embodiment of the present technology.

FIG. 19 is a circuit diagram illustrating a configuration example of the address event detection unit 400 according to the fifth embodiment of the present technology. The address event detection unit 400 according to the fifth embodiment is different from that of the first embodiment in further including the buffer 450.

The buffer 450 outputs a voltage signal from a logarithmic conversion unit 410 to a subtractor 420. The buffer 450 includes NMOS transistors 451 and 452. These transistors are connected in series between a power supply terminal and a ground terminal. Furthermore, a gate of the NMOS transistor 451 is connected to the logarithmic conversion unit 410, and a connection point of the NMOS transistors 451 and 452 is connected to the subtractor 420. A gate of the NMOS transistor 452 is connected to the power supply terminal.

The buffer 450 can improve the drive force for driving the subtractor 420 and the subsequent circuits. Furthermore, the buffer 450 can secure isolation of noise associated with a switching operation at the subsequent stage.

As described above, in the fifth embodiment of the present technology, since the buffer 450 is arranged at a preceding stage of the subtractor 420, the drive force of the circuits of and after the subtractor 420 can be improved.

6. Sixth Embodiment

In the above-described first embodiment, only one loop circuit including the PMOS transistors 411 and 412 is arranged in the logarithmic conversion unit 410. However, the conversion gain of when converting a current into a voltage may become insufficient if only one loop circuit is provided. A logarithmic conversion unit 410 according to a sixth embodiment is different from that of the first embodiment in being provided with two stages of loop circuits.

Figure 20:
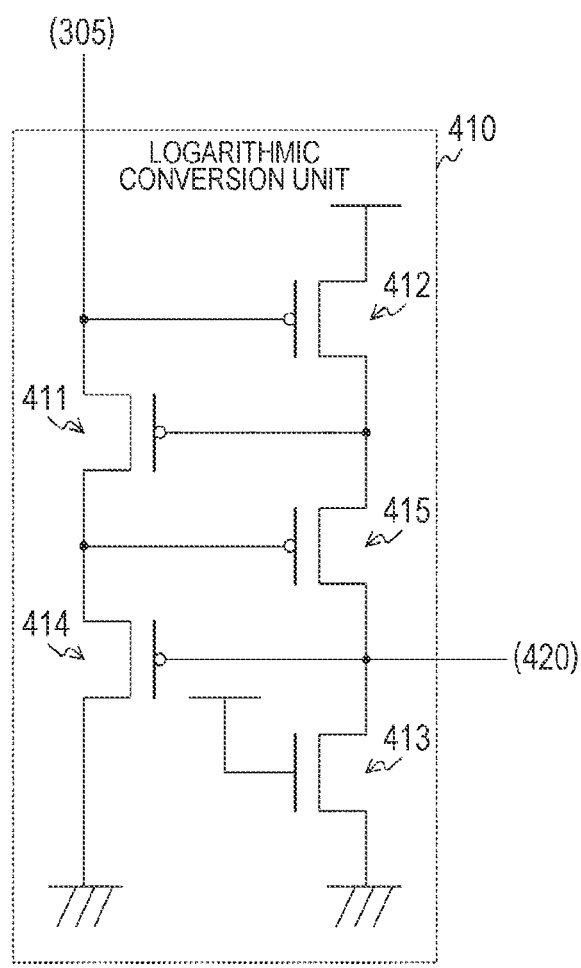
FIG. 20 is a circuit diagram illustrating a configuration example of a logarithmic conversion unit according to a sixth embodiment of the present technology.

FIG. 20 is a circuit diagram illustrating a configuration example of the logarithmic conversion unit 410 according to the sixth embodiment of the present technology. The logarithmic conversion unit 410 according to the sixth embodiment is different from that of the first embodiment in further including PMOS transistors 414 and 415.

PMOS transistors 411 and 414 are connected in series between a photodiode 305 and a ground terminal, and PMOS transistors 412 and 415 and an NMOS transistor 413 are connected in series between a power supply terminal and the ground terminal. Furthermore, a gate of the PMOS transistor 411 is connected to a connection point of the PMOS transistors 412 and 415, and a gate of the PMOS transistor 414 is connected to a connection point of the PMOS transistor 415 and the NMOS transistor 413.

Meanwhile, a gate of the PMOS transistor 412 is connected to a connection point of a photodiode 305 and the PMOS transistor 411. A gate of the PMOS transistor 415 is connected to a connection point of the PMOS transistors 411 and 414. Furthermore, a connection point of the PMOS transistor 415 and the NMOS transistor 413 is connected to a subtractor 420.

As described above, since a loop circuit including the PMOS transistors 411 and 412 and a loop circuit including the PMOS transistors 414 and 415 are connected in two stages, a conversion gain becomes doubled as compared with the case where the loop circuit has only one stage.

As described above, in the sixth embodiment of the present technology, since the two stages of loop circuits are provided in the logarithmic conversion unit 410, the conversion gain can be increased as compared with the case of only one stage.

7. Seventh Embodiment

In the above-described first embodiment, the PMOS transistors 411 and 412 are connected in a loop manner in the logarithmic conversion unit 410. The loop circuit may become a negative feedback circuit and a voltage signal may oscillate under a certain condition. A logarithmic conversion unit 410 according to a seventh embodiment is different from that of the first embodiment in improving stability by adding a capacitor.

Figure 21:
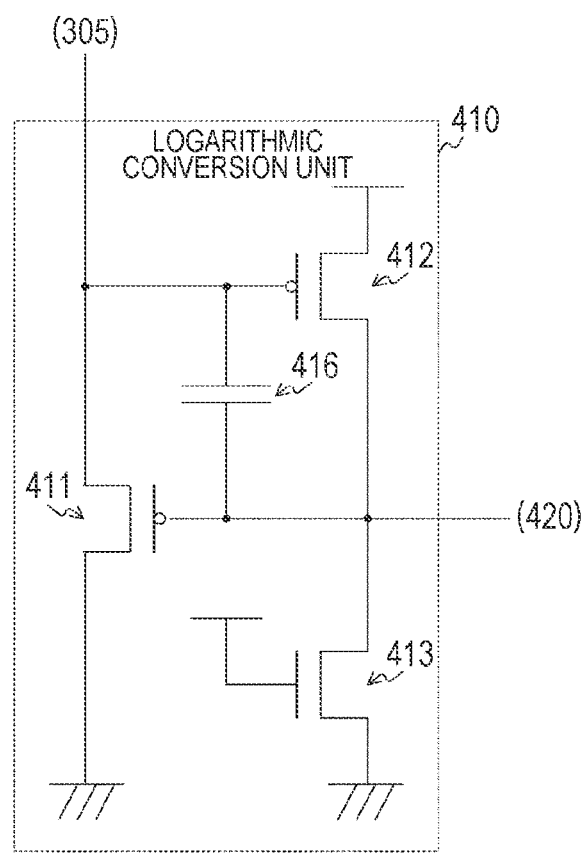
FIG. 21 is a circuit diagram illustrating a configuration example of a logarithmic conversion unit according to a seventh embodiment of the present technology.

FIG. 21 is a circuit diagram illustrating a configuration example of the logarithmic conversion unit 410 according to the seventh embodiment of the present technology. The logarithmic conversion unit 410 according to the seventh embodiment is different from that of the first embodiment in further including a capacitor 416.

One end of the capacitor 416 is connected to a gate of a PMOS transistor 412, and the other end of the capacitor 416 is connected to a gate of a PMOS transistor 411. The capacitor 416 can compensate for a phase delay of a voltage signal. For example, a capacitor element such as an inter-wiring capacitor or a transistor, in addition to a capacitor, can be used as the capacitor 416.

Here, a transfer function of the loop circuit including the PMOS transistors 411 and 412 in the case where the capacitor 416 is not provided is expressed by the following expression.

[Math. 1]

$$T_{open}(s) = \frac{g_m G_m R_0}{(g_m + sC_{pd})(1 + sC_0 R_0)} \quad \text{Expression 6}$$

In the above expression, $g_m$ represents transconductance of the PMOS transistor 411 and $G_m$ represents transconductance of the PMOS transistor 412. $R_0$ represents an output resistance of the loop circuit and s represents a complex number. $C_{pd}$ represents a source-side capacitance of the PMOS transistor 411, and $C_0$ represents a gate capacitance of the PMOS transistor 411. The unit of the transconductance is, for example, Siemens (S), and the unit of the resistor is, for example, ohm (Ω). Furthermore, the unit of the capacitance is, for example, farad (F).

In contrast, a transfer function considering an open loop gain of the loop circuit provided with the capacitor 416 is expressed by the following expression, assuming that a capacitance value $C_c$ of the capacitor is smaller than a parasitic capacitance attached to an output terminal.

[Math. 2]

$$T_{open}(s) \approx \frac{G_m R_0 (g_m + sC_C)}{\{g_m + s(C_{pd} + C_C)\}(1 + sC_0 R_0)} \qquad \text{Expression 7}$$

Furthermore, the following relational expression holds between $C_c$ and $C_0$. This relationship is an appropriate process by design.

$$C_c << C_0 \qquad \text{Expression 8}$$

From the expression 7, it can be seen that the addition of the capacitor creates a zero point at the position of $g_m/C_c$. The position of this zero point is proportional to $g_m$ and depends on illuminance. Therefore, the stability can be secured under the total illuminance condition by designing $C_c$ such that the capacitance value $C_c$ and Cpd+Cc do not significantly deviate from each other, considering a relationship of a corresponding illuminance-dependent pole (that is, the pole of $g_m/C_{pd}+C_c$). Note that the capacitance value Cc is favorably within a range of $C_{pd}/3$ to $C_{pd}/2$.

As described above, in the seventh embodiment of the present technology, the capacitor 416 is added in the loop circuit. Therefore, the phase delay of the voltage signal can be compensated. Thereby, the stability of the logarithmic conversion unit 410 can be improved.

8. Applications to Moving Bodies

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 22:
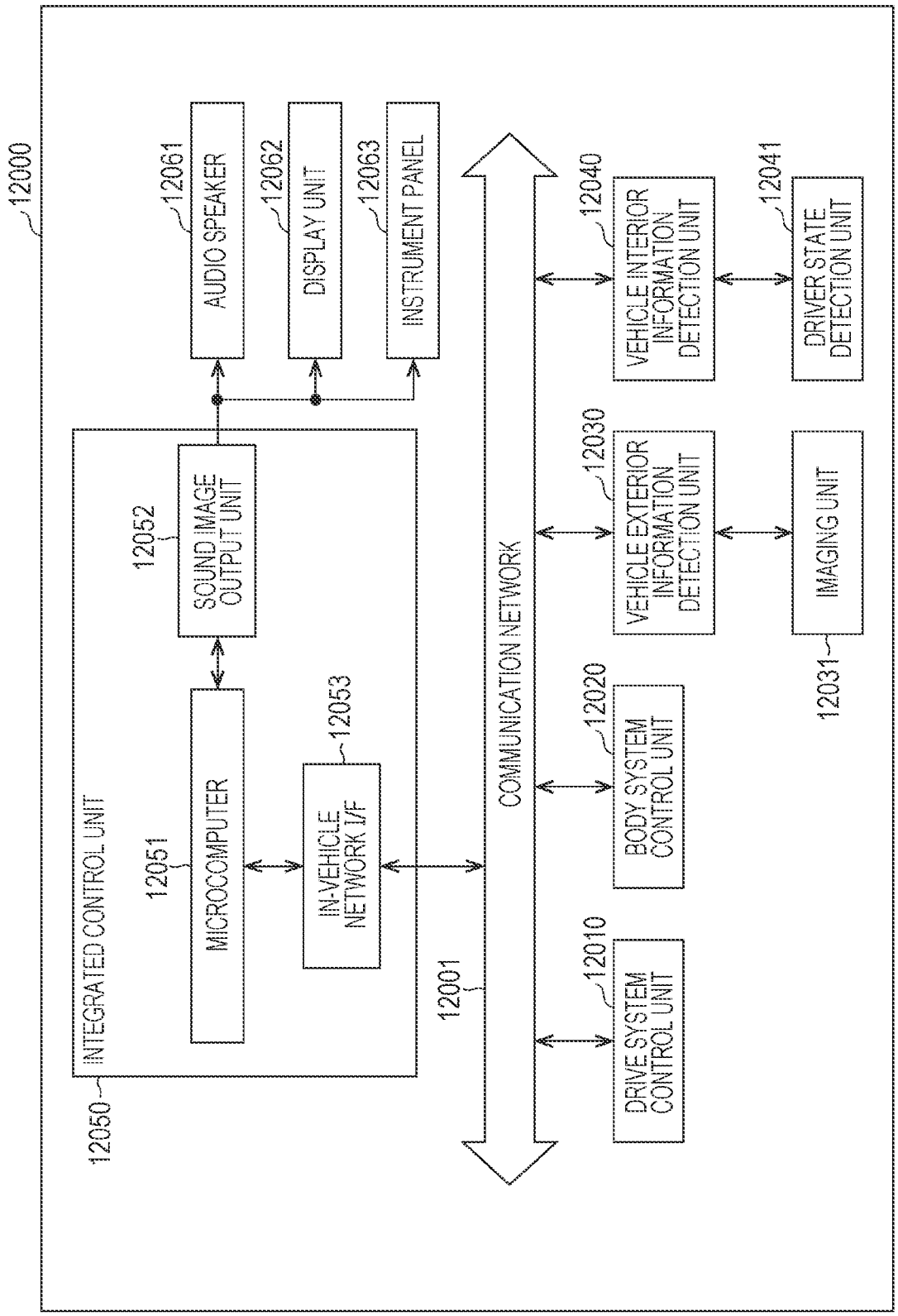
FIG. 22 is a block diagram illustrating an example of a schematic configuration of a vehicle control system.

FIG. 22 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 22, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 22, as the output device, an audio speaker 12061, a display unit 12062, and an instrument panel 12063 are exemplarily illustrated. The display unit 12062 may include, for example, at least one of an on-board display or a head-up display.

Figure 23:
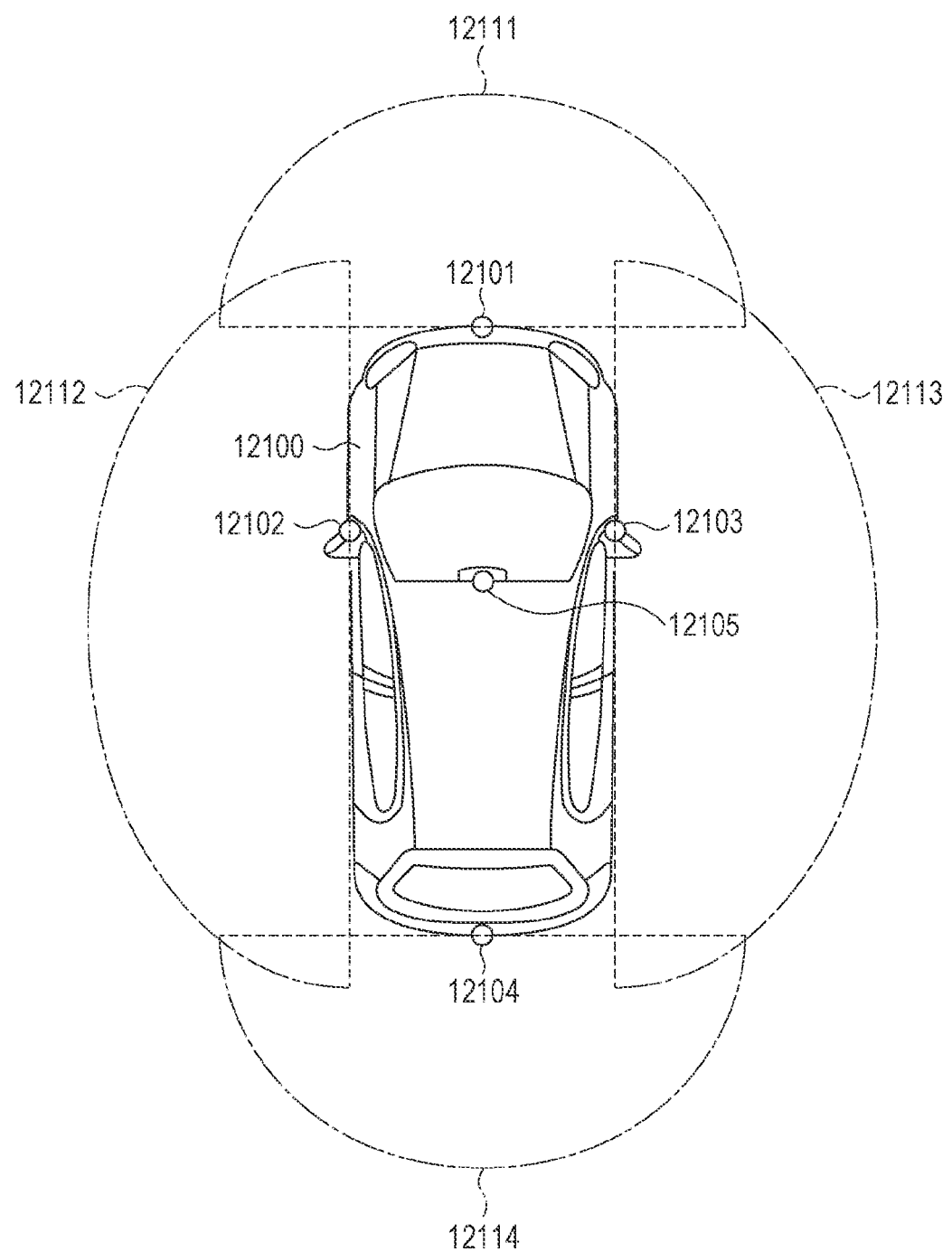
FIG. 23 is an explanatory diagram illustrating an example of installation positions of a vehicle exterior information detection unit and an imaging unit.

FIG. 23 is a diagram illustrating an example of an installation position of the imaging unit 12031.

In FIG. 23, imaging units 12101, 12102, 12103, 12104, and 12105 are included as the imaging unit 12031.

The imaging units 12101, 12102, 12103, 12104, and 12105 are provided at positions of a front nose, side mirrors, a rear bumper or a back door, an upper portion of a windshield, and the like in an interior of a vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires an image in back of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 23 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image sensor having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations. Specifically, the imaging device 100 can be applied to the imaging unit 12031. By applying the technology according to the present disclosure to the imaging unit 12031, a more easily viewable captured image with improved image quality can be obtained, and thus the driver's fatigue can be reduced.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Furthermore, the processing procedures described in the above embodiments may be regarded as a method having these series of procedures, and also regarded as a program for causing a computer to execute these series of procedures and as a recording medium for storing the program. As this recording medium, for example, a compact disc (CD), a mini disc (MD), a digital versatile disc (DVD), a memory card, a Blu-ray (registered trademark) disc, or the like can be used.

Note that the effects described in the present specification are merely examples and are not limited, and other effects may be exhibited.

Note that the present technology can also have the following configurations.

(1) A solid-state image sensor including:
a photodiode configured to generate electrons and holes by photoelectric conversion;
a pixel signal generation unit configured to generate a pixel signal of a voltage according to an amount of one of the electrons and the holes; and
a detection unit configured to detect whether or not a change amount in the other of the electrons and the holes has exceeded a predetermined threshold and output a detection signal.

(2) The solid-state image sensor according to (1), in which
the pixel signal generation unit generates the pixel signal of the voltage according to the amount of the electrons, and
the detection unit detects whether or not the change amount in the holes has exceeded the threshold.

(3) The solid-state image sensor according to (1) or (2), in which
the photodiode and a part of the pixel signal generation unit are arranged on a predetermined light-receiving chip, and
a rest of the pixel signal generation unit and the detection unit are arranged on a predetermined circuit chip.

(4) The solid-state image sensor according to (3), in which
the pixel signal generation unit includes
a pixel circuit configured to generate the pixel signal, and
a comparison circuit configured to compare the pixel signal with a predetermined reference signal,
the photodiode, the pixel circuit, and a part of the comparison circuit are arranged on the light-receiving chip, and
a rest of the comparison circuit and the detection unit are arranged on the circuit chip.

(5) The solid-state image sensor according to (3), in which
the pixel signal generation unit includes
a pixel circuit configured to generate the pixel signal, and
a comparison circuit configured to compare the pixel signal with a predetermined reference signal,
the photodiode and the pixel circuit are arranged on the light-receiving chip, and
the comparison circuit and the detection unit are arranged on the circuit chip.

(6) The solid-state image sensor according to any one of (1) to (5), further including:
a drive unit configured to drive the pixel signal generation unit to generate the pixel signal in a case where the detection unit detects that the change amount has exceeded the threshold.

(7) The solid-state image sensor according to any one of (1) to (5), further including:
a column processing unit configured to perform predetermined signal processing for the pixel signal and output the pixel signal; and
a control circuit configured to control the column processing unit to output the pixel signal in a case where the change amount having exceeded the threshold is detected within a predetermined exposure period.

(8) The solid-state image sensor according to any one of (1) to (7), in which
the photodiode, the pixel signal generation unit, and the detection unit are respectively arranged on a plurality of pixels, and
the pixel signal generation unit includes
a pixel circuit configured to generate the analog pixel signal, and
an analog-digital converter configured to convert the pixel signal into a digital signal and output the digital signal.

(9) The solid-state image sensor according to any one of (1) to (7), further including:
an analog-digital converter configured to convert the analog pixel signal into a digital signal, in which
the photodiode, the pixel signal generation unit, and the detection unit are respectively arranged on a plurality of pixels, and
the pixel signal generation unit generates the analog pixel signal and outputs the analog pixel signal to the analog-digital converter.

(10) The solid-state image sensor according to any one of (1) to (9), in which
the pixel signal generation unit includes
a charge accumulation unit configured to accumulate a charge of one of the electrons and the holes,
a floating diffusion layer configured to accumulate the charge and convert the charge into the voltage according to an amount of the charge,
a first transfer transistor configured to transfer the charge from the photodiode into the charge accumulation unit, and
a second transfer transistor configured to transfer the charge from the charge accumulation unit to the floating diffusion layer.

(11) The solid-state image sensor according to any one of (1) to (10), in which
the detection unit includes
a conversion unit configured to convert a photocurrent including the other of the electrons and the holes into a voltage,
a subtractor configured to obtain a change amount in the voltage by subtraction, and
a comparator configured to compare the change amount with the threshold and outputs a comparison result as the detection signal.

(12) The solid-state image sensor according to (11), in which
the detection unit further includes a buffer that outputs a signal of the voltage from the conversion unit to the subtractor.

(13) The solid-state image sensor according to (11) or (12), in which
the conversion unit includes a plurality of stages of loop circuits, and
each of the plurality of stages of loop circuits includes a pair of transistors connected in a loop manner.

(14) The solid-state image sensor according to (11) or (12), in which
the conversion unit includes
a pair of transistors connected in a loop manner, and
a capacitor connected to gates of the pair of transistors.

(15) An imaging device including:
a photodiode configured to generate electrons and holes by photoelectric conversion;
a pixel signal generation unit configured to generate a pixel signal of a voltage according to an amount of one of the electrons and the holes;
a detection unit configured to detect whether or not a change amount in the other of the electrons and the holes has exceeded a predetermined threshold and output a detection signal; and
a digital signal processing unit configured to perform predetermined processing for the detection signal and the pixel signal.

(16) A method of controlling a solid-state image sensor, the method including:
a pixel signal generation procedure of generating a pixel signal of a voltage according to an amount of one of the electrons and the holes generated by photoelectric conversion; and
a detection procedure of detecting whether or not a change amount in the other of the electrons and the holes has exceeded a predetermined threshold and outputting a detection signal.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state image sensor
201 Light-receiving chip
202 Circuit chip
211 DAC
212 Drive circuit
213 X arbiter
215 Control circuit
216 Y arbiter
230 Time code generation unit
240 Pixel array unit
241 Time code transfer unit
250 Column processing unit
260 Column ADC
300 Pixel
305 Photodiode
306 N layer
307 P layer
310 Pixel signal generation unit
311 Load MOS circuit
320 ADC
321 Comparison circuit
330 Pixel circuit
331 Discharge transistor
332, 337 Transfer transistor
333 Reset transistor
334 Floating diffusion layer
335 Amplification transistor
336 Selection transistor
338 Analog memory
340 Differential input circuit
341, 342, 411, 412, 414, 415 PMOS transistor
343 to 345, 413, 451, 452 NMOS transistor
350 Voltage conversion circuit
360 Positive feedback circuit
370 Data storage unit
400 Address event detection unit
410 Logarithmic conversion unit
416, 421, 423 Capacitor
420 Subtractor
422 Amplifier
424 Switch
430 Comparator
440 AER logic circuit
450 Buffer
12031 Imaging unit

The invention claimed is:

1. A solid-state image sensor comprising:
a photodiode configured to generate electrons and holes by photoelectric conversion;
a detection unit configured to detect whether or not a change amount in one of the electrons and the holes has exceeded a predetermined threshold and output a detection signal; and
a pixel signal generation unit configured to generate a pixel signal of a voltage based on the detection that the change amount in one of the electrons and the holes has exceeded the predetermined threshold, wherein the pixel signal of the voltage is generated according to an amount of one of the electrons and the holes.

2. The solid-state image sensor according to claim 1, wherein
the pixel signal generation unit generates the pixel signal of the voltage according to the amount of the electrons, and
the detection unit detects whether or not the change amount in the holes has exceeded the predetermined threshold.

3. The solid-state image sensor according to claim 1, wherein
the photodiode and a part of the pixel signal generation unit are arranged on a predetermined light-receiving chip, and
a rest of the pixel signal generation unit and the detection unit are arranged on a predetermined circuit chip.

4. The solid-state image sensor according to claim 3, wherein
the pixel signal generation unit includes:
a pixel circuit configured to generate the pixel signal; and
a comparison circuit configured to compare the pixel signal with a predetermined reference signal,
wherein the photodiode, the pixel circuit, and a part of the comparison circuit are arranged on the predetermined light-receiving chip, and
wherein a rest of the comparison circuit and the detection unit are arranged on the predetermined circuit chip.

5. The solid-state image sensor according to claim 3, wherein
the pixel signal generation unit includes:
a pixel circuit configured to generate the pixel signal; and
a comparison circuit configured to compare the pixel signal with a predetermined reference signal,
wherein the photodiode and the pixel circuit are arranged on the predetermined light-receiving chip, and
wherein the comparison circuit and the detection unit are arranged on the predetermined circuit chip.

6. The solid-state image sensor according to claim 1, further comprising
a drive unit configured to drive the pixel signal generation unit to generate the pixel signal.

7. The solid-state image sensor according to claim 1, further comprising:
a column processing unit configured to perform predetermined signal processing for the pixel signal and output the pixel signal; and
a control circuit configured to control the column processing unit to output the pixel signal in a case where the change amount having exceeded the predetermined threshold is detected within a predetermined exposure period.

8. The solid-state image sensor according to claim 1, wherein
the photodiode, the pixel signal generation unit, and the detection unit are respectively arranged on a plurality of pixels, and
the pixel signal generation unit includes:
a pixel circuit configured to generate the pixel signal; and
an analog-digital converter configured to convert the pixel signal into a digital signal and output the digital signal.

9. The solid-state image sensor according to claim 1, further comprising
an analog-digital converter configured to convert the pixel signal into a digital signal, wherein
the photodiode, the pixel signal generation unit, and the detection unit are respectively arranged on a plurality of pixels, and
the pixel signal generation unit generates the pixel signal as an analog pixel signal and outputs the analog pixel signal to the analog-digital converter.

10. The solid-state image sensor according to claim 1, wherein
the pixel signal generation unit includes:
a charge accumulation unit configured to accumulate a charge of one of the electrons and the holes;
a floating diffusion layer configured to accumulate the charge and convert the charge into the voltage according to an amount of the charge;
a first transfer transistor configured to transfer the charge from the photodiode into the charge accumulation unit; and
a second transfer transistor configured to transfer the charge from the charge accumulation unit to the floating diffusion layer.

11. The solid-state image sensor according to claim 1, wherein
the detection unit includes:
a conversion unit configured to convert a photocurrent including one of the electrons and the holes into the voltage;
a subtractor configured to obtain the change amount in the voltage by subtraction; and
a comparator configured to compare the change amount with the predetermined threshold and output a comparison result as the detection signal.

12. The solid-state image sensor according to claim 11, wherein
the detection unit further includes a buffer that outputs a signal of the voltage from the conversion unit to the subtractor.

13. The solid-state image sensor according to claim 11, wherein
the conversion unit includes a plurality of stages of loop circuits, and
each of the plurality of stages of the loop circuits includes a pair of transistors connected in a loop manner.

14. The solid-state image sensor according to claim 11, wherein
the conversion unit includes:
a pair of transistors connected in a loop manner; and
a capacitor connected to gates of the pair of transistors.

15. An imaging device comprising:
a photodiode configured to generate electrons and holes by photoelectric conversion;
a pixel signal generation unit configured to generate a pixel signal of a voltage according to an amount of one of the electrons and the holes;
a detection unit configured to detect whether or not a change amount in one of the electrons and the holes has exceeded a predetermined threshold and output a detection signal;
a digital signal processing unit configured to perform a predetermined processing for the detection signal and the pixel signal;
a predetermined light-receiving chip that has the photodiode and a part of the pixel signal generation unit arranged thereon; and
a predetermined circuit chip that has a rest of the pixel signal generation unit and the detection unit arranged thereon.

16. A method of controlling a solid-state image sensor, the method comprising:
detecting whether or not a change amount in one of electrons and holes, generated by photoelectronic conversion, has exceeded a predetermined threshold; and
generating a pixel signal of a voltage based on the detection that the change amount in one of the electrons and the holes has exceeded the predetermined threshold, wherein the pixel signal of the voltage is generated according to an amount of one of the electrons and the holes generated by the photoelectric conversion.

* * * * *